United States Patent
Tokutomi et al.

(10) Patent No.: US 11,211,138 B2
(45) Date of Patent: Dec. 28, 2021

(54) MEMORY SYSTEM

(71) Applicant: KIOXIA CORPORATION, Tokyo (JP)

(72) Inventors: Tsukasa Tokutomi, Kamakura Kanagawa (JP); Kiwamu Watanabe, Kawasaki Kanagawa (JP); Yuko Noda, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/003,937

(22) Filed: Aug. 26, 2020

(65) Prior Publication Data

US 2021/0090682 A1 Mar. 25, 2021

(30) Foreign Application Priority Data

Sep. 19, 2019 (JP) .............................. JP2019-170739

(51) Int. Cl.
| | |
|---|---|
| *G11C 29/50* | (2006.01) |
| *G11C 29/42* | (2006.01) |
| *G11C 29/44* | (2006.01) |
| *G11C 16/08* | (2006.01) |
| *G11C 16/30* | (2006.01) |
| *G11C 16/10* | (2006.01) |
| *G11C 16/26* | (2006.01) |

(52) U.S. Cl.
CPC ........ *G11C 29/50004* (2013.01); *G11C 16/08* (2013.01); *G11C 16/10* (2013.01); *G11C 16/26* (2013.01); *G11C 16/30* (2013.01); *G11C 29/42* (2013.01); *G11C 29/44* (2013.01)

(58) Field of Classification Search
CPC ...................................................... G11C 29/42
See application file for complete search history.

(56) References Cited

U.S. PATENT DOCUMENTS

| | | | |
|---|---|---|---|
| 9,069,659 B1 | 6/2015 | Sabbag et al. | |
| 10,121,536 B2 | 11/2018 | Wang et al. | |
| 10,559,363 B2* | 2/2020 | Jung | ........................ G11C 16/24 |
| 2014/0281141 A1* | 9/2014 | Manohar | ............. G06F 12/0246 711/103 |

(Continued)

FOREIGN PATENT DOCUMENTS

| | | |
|---|---|---|
| JP | 2017224370 A | 12/2017 |
| JP | 2018045750 A | 3/2018 |

(Continued)

*Primary Examiner* — Douglas King
(74) *Attorney, Agent, or Firm* — Kim & Stewart LLP

(57) ABSTRACT

A memory system includes a memory chip and a memory controller. The memory chip has a first plane and a second plane. A threshold voltage corresponding to multiple bit data is set for each of the memory cells. The memory controller causes the memory chip to execute a first read process on the first plane and the second plane in parallel by using a plurality of first read voltages different from each other for the first plane and the second plane. The first read process being a process of reading a data group of one bit among the multiple bits by using the first read voltages. The memory controller subsequently adjusts the voltage levels of the first read voltages on the basis of the data group read from the memory cells of the first plane and the data group read from the memory cells of the second plane.

20 Claims, 26 Drawing Sheets

(56) References Cited

U.S. PATENT DOCUMENTS

| | | | |
|---|---|---|---|
| 2016/0042797 A1* | 2/2016 | Kim | G11C 29/52 |
| | | | 714/764 |
| 2016/0283111 A1 | 9/2016 | Guo et al. | |
| 2017/0309340 A1 | 10/2017 | Shah et al. | |
| 2017/0365335 A1 | 12/2017 | Wang et al. | |
| 2018/0082743 A1 | 3/2018 | Bushnaq | |
| 2018/0277226 A1 | 9/2018 | Tokutomi et al. | |
| 2019/0391758 A1 | 12/2019 | Fujiu et al. | |
| 2020/0051622 A1* | 2/2020 | Wang | G06F 3/0688 |

FOREIGN PATENT DOCUMENTS

| | | |
|---|---|---|
| JP | 2018163724 A | 10/2018 |
| JP | 2020004465 A | 1/2020 |

\* cited by examiner

FIG. 9

| | (1) | (2) | (3) | (4) | (5) | (6) | (7) | (8) | (9) | (10) | (11) | (12) | (13) | (14) | (15) | (16) | (17) | (18) | (19) | (20) | (21) | (22) | (23) | (24) |
|---|---|---|---|---|---|---|---|---|---|---|---|---|---|---|---|---|---|---|---|---|---|---|---|---|
| CR | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| ER | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| HR | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 |
| SFT1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 1 |
| SFT2 | 1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 |
| SFT3 | 1 | 1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 |
| SFT4 | 1 | 1 | 1 | 1 | 0 | 0 | 0 | 0 | 0 | 0 | 1 | 1 | 1 | 1 | 1 | 1 | 0 | 0 | 0 | 0 | 0 | 0 | 1 | 1 |
| SFT5 | 1 | 1 | 1 | 1 | 1 | 0 | 0 | 0 | 0 | 0 | 0 | 1 | 1 | 1 | 1 | 1 | 1 | 0 | 0 | 0 | 0 | 0 | 0 | 1 |

Columns (1)–(6): SEPARATE AR BY USING SFT AND CR

Columns (7)–(12): SEPARATE DR BY USING ~(SFT AND ~(CR^ER))

Columns (13)–(18): SEPARATE FR BY USING SFT AND (ER^HR)

Columns (19)–(24): SEPARATE KR BY USING ~(SFT AND (~HR))

FIG. 12

| | (25) | (26) | (27) | (28) | (29) | (30) | (31) | (32) | (33) | (34) | (35) | (36) | (37) | (38) | (39) | (40) | (41) | (42) | (43) | (44) | (45) | (46) | (47) | (48) |
|---|---|---|---|---|---|---|---|---|---|---|---|---|---|---|---|---|---|---|---|---|---|---|---|---|
| ER | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| HR | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| KR | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 |
| SFT1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 1 |
| SFT2 | 1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 |
| SFT3 | 1 | 1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 |
| SFT4 | 1 | 1 | 1 | 1 | 0 | 0 | 0 | 0 | 0 | 0 | 1 | 1 | 1 | 1 | 1 | 1 | 0 | 0 | 0 | 0 | 0 | 0 | 1 | 1 |
| SFT5 | 1 | 1 | 1 | 1 | 1 | 0 | 0 | 0 | 0 | 0 | 0 | 1 | 1 | 1 | 1 | 1 | 1 | 0 | 0 | 0 | 0 | 0 | 0 | 1 |

Columns (25)–(30): SEPARATE CR BY USING SFT AND ER

Columns (31)–(36): SEPARATE GR BY USING SFT AND ~(SFT AND ~(ER^HR))

Columns (37)–(42): SEPARATE IR BY USING SFT AND (HR^KR)

Columns (43)–(48): SEPARATE MR BY USING SFT AND ~(SFT AND ~KR))

FIG. 16

| | (67) | (68) | (69) | (70) | (71) | (72) | (73) | (74) | (75) | (76) | (77) | (78) | (79) | (80) | (81) | (82) | (83) | (84) | (85) | (86) | (87) | (88) | (89) | (90) |
|---|---|---|---|---|---|---|---|---|---|---|---|---|---|---|---|---|---|---|---|---|---|---|---|---|
| HR | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| KR | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| MR | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 |
| SFT1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 1 |
| SFT2 | 1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 |
| SFT3 | 1 | 1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 |
| SFT4 | 1 | 1 | 1 | 1 | 0 | 0 | 0 | 0 | 0 | 0 | 1 | 1 | 1 | 1 | 1 | 1 | 0 | 0 | 0 | 0 | 0 | 0 | 1 | 1 |
| SFT5 | 1 | 1 | 1 | 1 | 1 | 0 | 0 | 0 | 0 | 0 | 0 | 1 | 1 | 1 | 1 | 1 | 1 | 0 | 0 | 0 | 0 | 0 | 0 | 1 |

Columns (67)–(72): SEPARATE ER BY USING SFT AND HR

Columns (73)–(78): SEPARATE JR BY USING SFT AND ~(HR^KR)

Columns (79)–(84): SEPARATE LR BY USING SFT AND (KR^MR)

Columns (85)–(90): SEPARATE OR BY USING ~(SFT AND (~MR))

Busy

Busy

Busy

MEMORY SYSTEM

CROSS-REFERENCE TO RELATED APPLICATION(S)

This application is based upon and claims the benefit of priority from Japanese Patent Application No. 2019-170739, filed Sep. 19, 2019, the entire contents of which are incorporated herein by reference.

FIELD

Embodiments described herein relate generally to a memory system.

BACKGROUND

There currently are memory systems that have nonvolatile memory cells. In such a memory system, data stored in the memory cell is determined on the basis of comparison between a threshold voltage of the memory cell and a read voltage.

A threshold voltage of the memory cell may change due to various factors other than the data stored therein. The memory system is configured to be able to adjust a read voltage such that correct data can be obtained from the memory cell even though a threshold voltage of the memory cell changes.

BRIEF DESCRIPTION OF THE DRAWINGS

FIG. 9 is a diagram illustrating, for different segments, data values obtained through five shift read operations in the lower estimation process, and sensing results in a C read operation, an E read operation, and an H read operation.

FIG. 12 is a diagram illustrating, for different segments, data values obtained through five shift read operations in the middle estimation process, and sensing results in an E read operation, an H read operation, and a K read operation, according to a first embodiment.

FIG. 16 is a diagram illustrating, for different segments, data values obtained through five shift read operations in the top estimation process, and sensing results in an H read operation, a K read operation, and an M read operation, according to a first embodiment.

DETAILED DESCRIPTION

Embodiments provide a memory system capable of reducing the time required to adjust a read voltage.

In general, according to one embodiment, a memory system includes a memory chip and a memory controller. The memory chip has a first plane and a second plane. The first plane and the second plane each include a plurality of memory cells and a word line connected to the plurality of memory cells. The memory cells have a threshold voltage corresponding to multi-bit data. The memory controller causes the memory chip to execute a first read process on the first plane and the second plane in parallel using a plurality of first read voltages, the first read voltages used for the first plane and the for the second plane being at different voltage levels from each other. The first read process is a process of reading a data group of one bit from the plurality of memory cells using the plurality of first read voltages. In some contexts, the first read voltages can be referred to as shifted read voltages and the first read process can be referred to as a multi-plane, shift read process. The memory controller adjusts (optimizes) voltage levels of the first read voltages on the basis of the data group read from of the first plane and the data group read from the second plane.

Hereinafter, with reference to the drawings, a memory system related to certain example embodiments will be described. The present disclosure is not limited to the example embodiments.

First Embodiment

Figure 1:
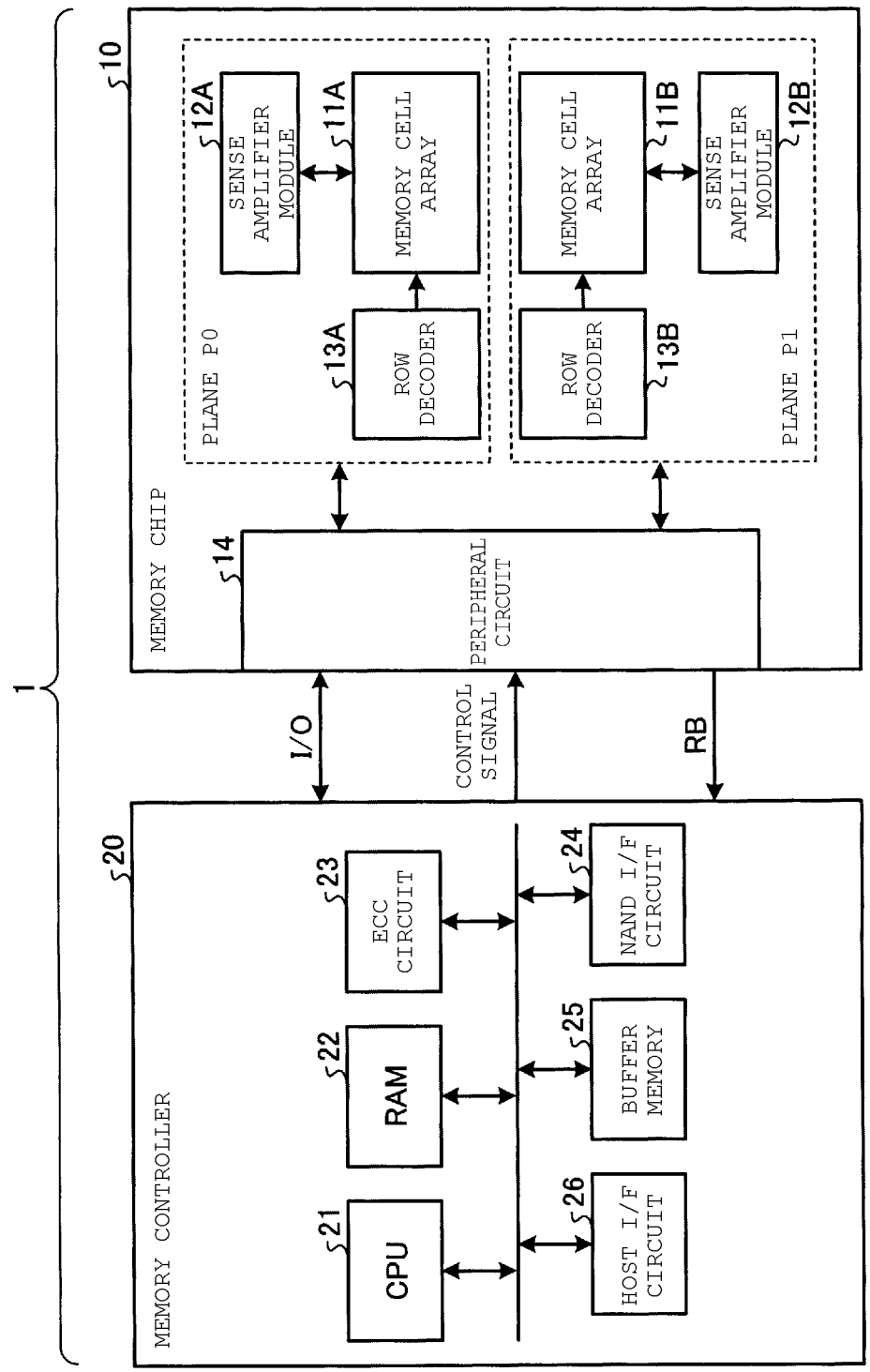
FIG. 1 is a schematic diagram illustrating a configuration of a memory system according to a first embodiment.

FIG. 1 is a schematic diagram illustrating an example of a configuration of a memory system 1 that may be used according to a first embodiment. The memory system. 1 includes a memory chip 10 and a memory controller 20. In the example illustrated in FIG. 1, the memory system 1 includes a single memory chip 10, whereas memory system 1 may include two or more memory chips 10.

The memory chip 10 is a NAND flash memory storing data in a nonvolatile manner. The memory chip 10 includes memory cell arrays each of which is a region storing data, and has a plurality of planes that can be separately controlled. In the example illustrated in FIG. 1, the memory chip 10 has two planes P0 and P1 as examples of the plurality of planes. A detailed configuration of the memory chip 10 will be described later.

The memory controller 20 instructs the memory chip 10 to perform a read operation, a write operation, and an erase operation in response to a command from an external host apparatus.

The memory controller 20 illustrated in FIG. 1 includes a central processing unit (CPU) 21, a random access memory (RAM) 22, an error checking and correcting (ECC) circuit 23, a NAND interface (I/F) circuit 24, a buffer memory 25, and a host interface (I/F) circuit 26.

The CPU 21 controls the overall operation of the memory controller 20 on the basis of a firmware program stored in memory accessible by the CPU 21.

The RAM 22 is a semiconductor memory such as a dynamic random access memory (DRAM) or a static random access memory (SRAM), and is used as a work region of the CPU 21. The RAM 22 stores firmware programs for managing the memory chip 10 or various management tables.

The ECC circuit 23 performs an error correction process on data. Specifically, the ECC circuit 23 generates a parity on the basis of write data during writing of data. The ECC circuit 23 generates a syndrome from the parity during reading of data to detect an error, and corrects the detected error.

The NAND interface circuit 24 is connected to the memory chip 10, and performs communication with the memory chip 10. For example, the NAND interface circuit 24 transmits and receives input/output signals I/O to and from the memory chip 10. The NAND interface circuit 24 transmits various control signals for the memory chip 10, and receives a ready/busy signal RB from the memory chip 10. The signal RB is a signal notifying the memory controller 20 whether the memory chip 10 is in a ready state or a busy state. The ready state indicates the memory chip 10 is ready to receive a command from the memory controller 20, and the busy state indicates the memory chip 10 cannot receive a command therefrom.

The buffer memory 25 temporarily stores data or the like received from the memory chip 10 and the host apparatus by the memory controller 20.

The host interface circuit 26 is connected to the host apparatus via a host bus or the like), and performs communication with the host apparatus. For example, the host interface circuit 26 transmits a command and data received from the host apparatus to the CPU 21 and the buffer memory 25, respectively.

As illustrated in FIG. 1, the memory chip 10 includes the plane P0, the plane P1, and a peripheral circuit 14. The plane P0 includes a memory cell array 11A, a sense amplifier module 12A, and a row decoder 13A. The plane P1 includes a memory cell array 11B, a sense amplifier module 12B, and a row decoder 13B.

The memory cell arrays 11A and 11B will be collectively referred to as a memory cell array 11 in some cases. Similarly, the sense amplifier modules 12A and 12B will be collectively referred to as a sense amplifier module 12 in some cases. And similarly, the row decoders 13A and 13B will be collectively referred to as a row decoder 13 in some cases.

Each of the memory cell arrays 11A and 11B includes a plurality of nonvolatile memory cells associated with a bit line and a word line. A detailed configuration of the memory cell array 11 will be described later.

The sense amplifier modules 12A and 12B respectively correspond to the memory cell arrays 11A and 11B. The sense amplifier module 12 reads data from the memory cell array 11, and outputs the read data to the memory controller 20. The sense amplifier module 12 transmits write data received from the memory controller 20, to the memory cell array 11. The sense amplifier module 12 includes a data latch (a data latch XDLC which will be described later), in which the data latch is used to perform transmission and reception of data with the peripheral circuit 14.

The row decoders 13A and 13B respectively correspond to the memory cell arrays 11A and 11B. The row decoder 13 selects a word line corresponding to a target memory cell on which a read operation and a write operation are performed. The row decoder 13 applies a desired voltage to each of the selected word line and a non-selected word line.

The planes described above are units in which a read operation, a write operation, and an erase operation can be separately executed. Specifically, the memory chip 10 may execute a read operation, a write operation, or an erase operation on only one plane of two planes that comprise the memory chip 10, and may execute a read operation, a write operation, or an erase operation on the other plane while executing a read operation, a write operation, or an erase operation on the one plane. In other words, the plane is the minimum unit that is a target of a read operation, a write operation, and an erase operation, and the operations may be performed on each plane, and may be performed on a plurality of planes in parallel. A configuration of the plane is not limited to the above configuration, and each plane may include at least the memory cell array 11.

Figure 2:
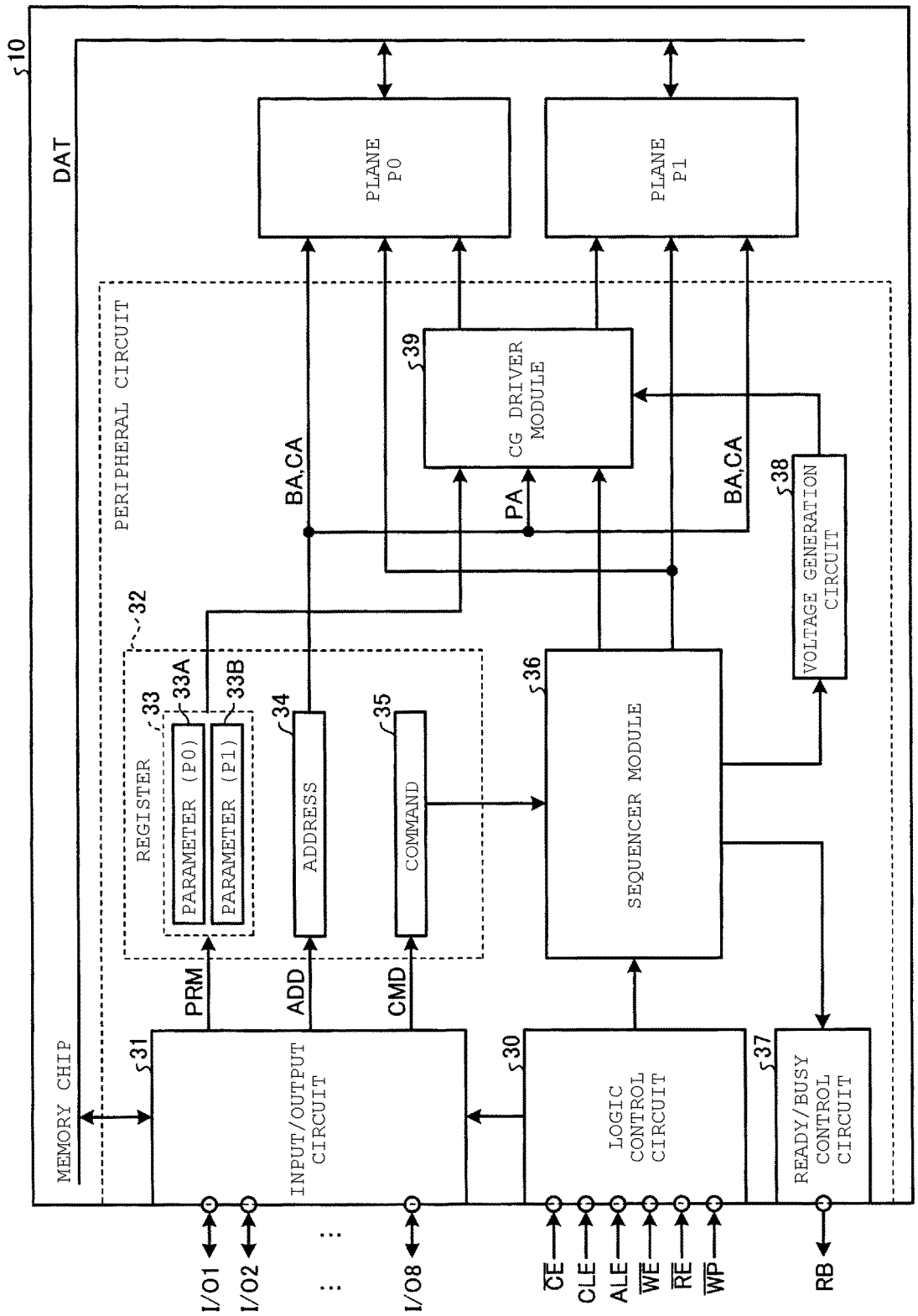
FIG. 2 is a diagram illustrating a configuration of a memory chip according to a first embodiment.

Next, with reference to FIG. 2, a description will be made of a detailed configuration of the peripheral circuit 14 controlling the plane P0 and the plane P1. FIG. 2 is a block diagram illustrating the memory chip 10, and illustrates a configuration of the peripheral circuit 14 controlling each plane and examples of signals transmitted and received between the memory chip 10 and the memory controller 20.

As illustrated in FIG. 2, the peripheral circuit 14 includes a logic control circuit 30, an input/output circuit 31, a register 32, a sequencer module 36, a ready/busy control circuit 37, a voltage generation circuit 38, and a CG driver module 39.

The logic control circuit 30 transmits various control signals received from the memory controller 20, to the input/output circuit 31 and the sequencer module 36. The control signals include, for example, a chip enable signal /CE, a command latch enable signal CLE, an address latch enable signal ALE, a write enable signal /WE, a read enable signal /RE, and a write protect signal /WP. The signal /CE is a signal for enabling the memory chip 10. The signal CLE is a signal for notifying the input/output circuit 31 that a signal input to the memory chip 10 along with the asserted signal CLE indicates the command CMD. The signal ALE is a signal for notifying the input/output circuit 31 that a signal input to the memory chip 10 along with the asserted signal ALE indicates address information ADD. The signals /WE and /RE are, for example, respectively signals for instructing the input/output circuit 31 to receive and output the input/output signals I/O. The signal /WP is, for example, a signal for bringing the memory chip 10 into a protection state during ON and OFF of a power source.

The input/output circuit 31 transmits and receives, for example, the input/output signals I/O (I/O1 to I/O8) with 8-bit widths to and from the memory controller 20. The input/output signals I/O transmitted from the input/output circuit 31 to the memory controller 20 may include, for example, read data DAT. The input/output signals I/O received from the memory controller 20 by the input/output circuit 31 may include, for example, the command CMD, the address information ADD, and write data DAT. For example, the input/output circuit 31 transmits the write data DAT received from the memory controller 20 to the sense amplifier module 12, and transmits the read data DAT transmitted from the sense amplifier module 12 to the memory controller 20.

The register 32 includes parameter registers 33A and 33B, an address register 34, and a command register 35. The parameter registers 33A and 33B will be collectively referred to as a parameter register 33 in some cases.

Each of the parameter registers 33A and 33B stores a parameter PRM. The parameter register 33A corresponds to the plane P0, and the parameter register 33B corresponds to the plane P1. A value of the parameter stored in the parameter register 33 is set according to a set feature command sequence which will be described later. The parameter register 33 receives the parameter data PRM from the input/output circuit 31, and stores the parameter data PRM. The parameter data PRM is used for various operations.

The address register 34 receives the address information ADD from the input/output circuit 31, and stores the address information ADD. The address register 34 transmits a column address CA, a block address BA, and a page address PA included in the address information ADD to the sense amplifier module 12, the row decoder 13, and the CG driver module 39, respectively.

The command register 35 receives the command CMD from the input/output circuit 31, and stores the command CMD. The sequencer module 36 executes various operations on the basis of the command CMD stored in the command register 35.

The sequencer module 36 controls the overall operation of the memory chip 10. Specifically, the sequencer module 36 controls the sense amplifier module 12, the row decoder 13, the voltage generation circuit 38, and the CG driver module 39 on the basis of the command CMD transmitted from the command register 35, and thus executes a read operation and the like.

The sequencer module 36 may execute various operations such as a read operation, a write operation, and an erase operation on the planes P0 and P1.

The ready/busy control circuit 37 generates the ready/busy signal RB based on an operation state of the sequencer module 36, and transmits the signal to the memory controller 20.

The voltage generation circuit 38 generates a desired voltage on the basis of an instruction from the sequencer module 36. The voltage generation circuit 38 supplies the generated voltage to the memory cell array 11, the sense amplifier module 12, and the CG driver module 39.

The CG driver module 39 transmits the voltage supplied from the voltage generation circuit 38 to the row decoders 13A and 13B on the basis of the received page address PA. The CG driver module 39 may adjust the voltage supplied from the voltage generation circuit 38, and may transmit the adjusted voltage to the row decoders 13A and 13B.

An example of voltage adjustment may be adjustment of a voltage (read voltage) applied to a selected word line during a read operation. As will be described later in detail, the memory chip 10 may execute a shift read operation of performing a read operation by shifting a read voltage. A difference from a default value of a read voltage may be set as the parameter data PRM for the parameter register 33. The difference will be referred to as a shift amount. The CG driver module 39 may generate a voltage with a value obtained by shifting the default value by the shift amount stored in the parameter register 33, and may supply the generated voltage to the row decoder 13.

Here, the CG driver module 39 may adjust a voltage to be supplied to the row decoder 13A on the basis of the parameter P0 stored in the parameter register 33A. The CG driver module 39 may adjust a voltage to be supplied to the row decoder 13B on the basis of the parameter P1 stored in the parameter register 33B. In other words, the CG driver module 39 may generate a separate read voltage for each plane.

As mentioned above, the memory chip 10 according to the present embodiment has a plurality of planes each including the row decoder 13 and the sense amplifier module 12. Consequently, the memory chip 10 can cause the plurality of planes to execute various operations in parallel. When the plurality of planes execute read operations in parallel, the memory chip 10 can cause each plane to use a separate read voltage.

In the following description, a plurality of planes executing read operations in parallel will be referred to as a multi-plane read operation. A read operation executed by each plane in the multi-plane read operation may be a read operation using a default read voltage, and may be a read operation (that is, a shift read operation) using a shifted read voltage. Different read voltages may be used in read operations executed by the respective planes in the multi-plane read operation. Read operations executed by a plurality of planes in the multi-plane read operation may be started at timings synchronized with each other, and may be started at timings not synchronized with each other (asynchronous timings).

A read operation executed by each plane in the multi-plane read operation may be a single-state read operation.

A single plane executing a read operation at a timing not overlapping other planes will be referred to as a single-plane read operation.

A plurality of planes executing write operations in parallel will be referred to as a multi-plane write operation.

Figure 3:
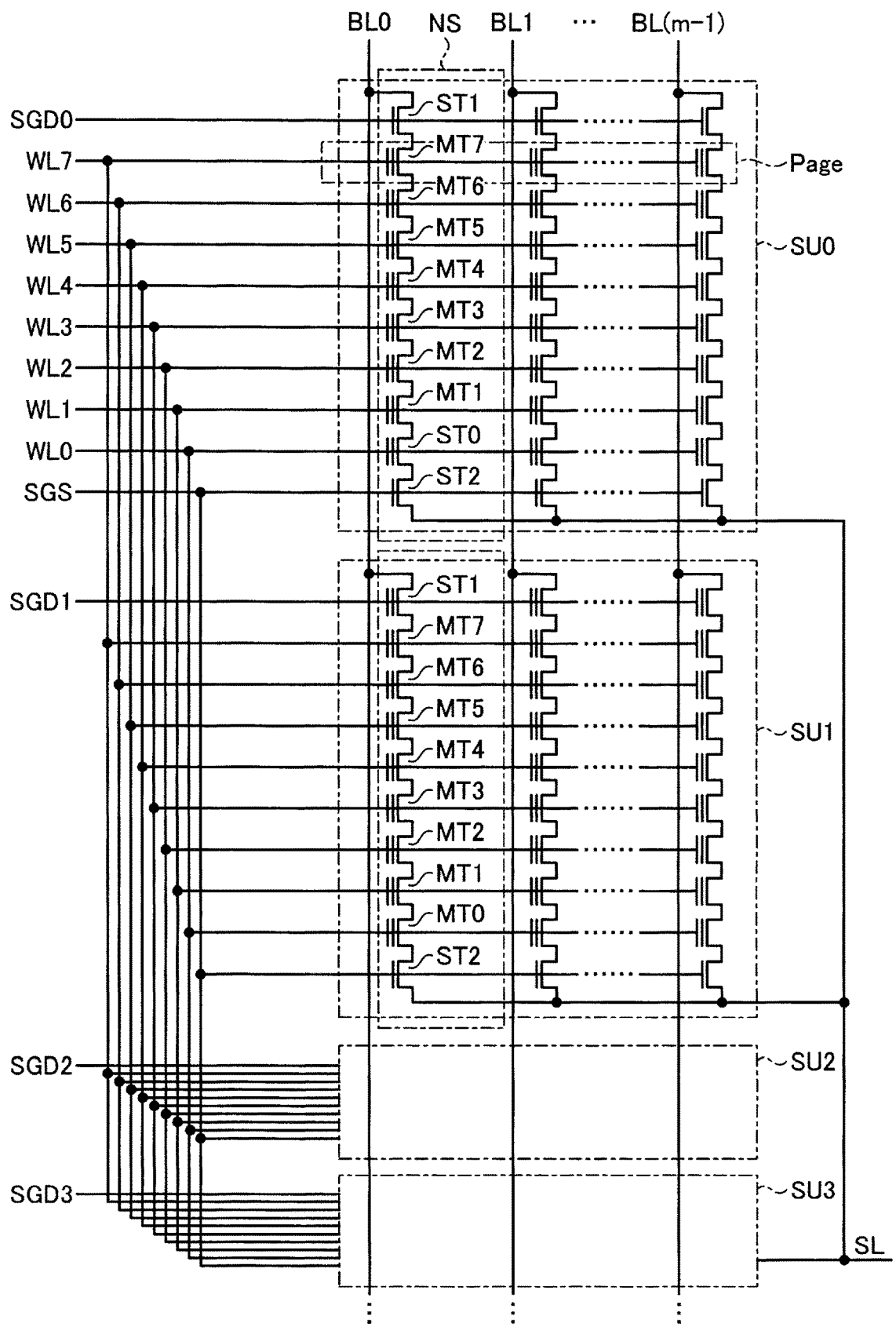
FIG. 3 is a diagram illustrating a circuit configuration of a single block in a memory system according to a first embodiment.

Next, a description will be made of a configuration of the memory cell array 11. The memory cell array 11 includes a plurality of blocks BLK. FIG. 3 is a diagram illustrating an example of a circuit configuration of a single block BLK that may be used according to the first embodiment.

The block BLK has, for example, four string units SU. Each of the string units SU has m NAND strings NS. The number of NAND strings NS corresponds to the number of bit lines BL. The number of string units SU of the block BLK is not limited to that depicted. Likewise, the number of memory cell transistors MT in a single NAND string NS is not limited to that depicted.

Gates of select transistors ST1 in string units SU0 to SU3 are respectively connected in common to select gate lines SGD0 to SGD3. Gates of select transistors ST2 in the same block are connected in common to a select gate line SG5. Similarly, control gates of memory cell transistors MT0 to MT7 in the same block are respectively connected in common to word lines WL0 to WL7.

Drains of the select transistor ST1 of the NAND string NS located in the same column in the memory cell array 11 is connected in common to the bit line BL. In other words, the bit line BL connects the NAND strings NS located in the same column to each other among the plurality of blocks BLK. Sources of the plurality of select transistors ST2 are connected in common to a source line SL.

Each of the memory cell transistors MT includes a control gate and a charge storage layer, and stores data in a nonvolatile manner. The memory cell transistor MT may store data of two or more bits.

In the above configuration, a set of 1-bit data stored in a plurality of memory cell transistors MT connected to the common word line WL in a single string unit SU will be referred to as a "page". Therefore, for example, when data of a plurality of bits is stored in the memory cell transistor MT, data of a plurality of pages is stored in a set of a plurality of memory cell transistors MT connected to the single word line WL. A read operation and a write operation may be performed for each page. Alternatively, a read operation and a write operation may be performed for each word line.

Figure 4:
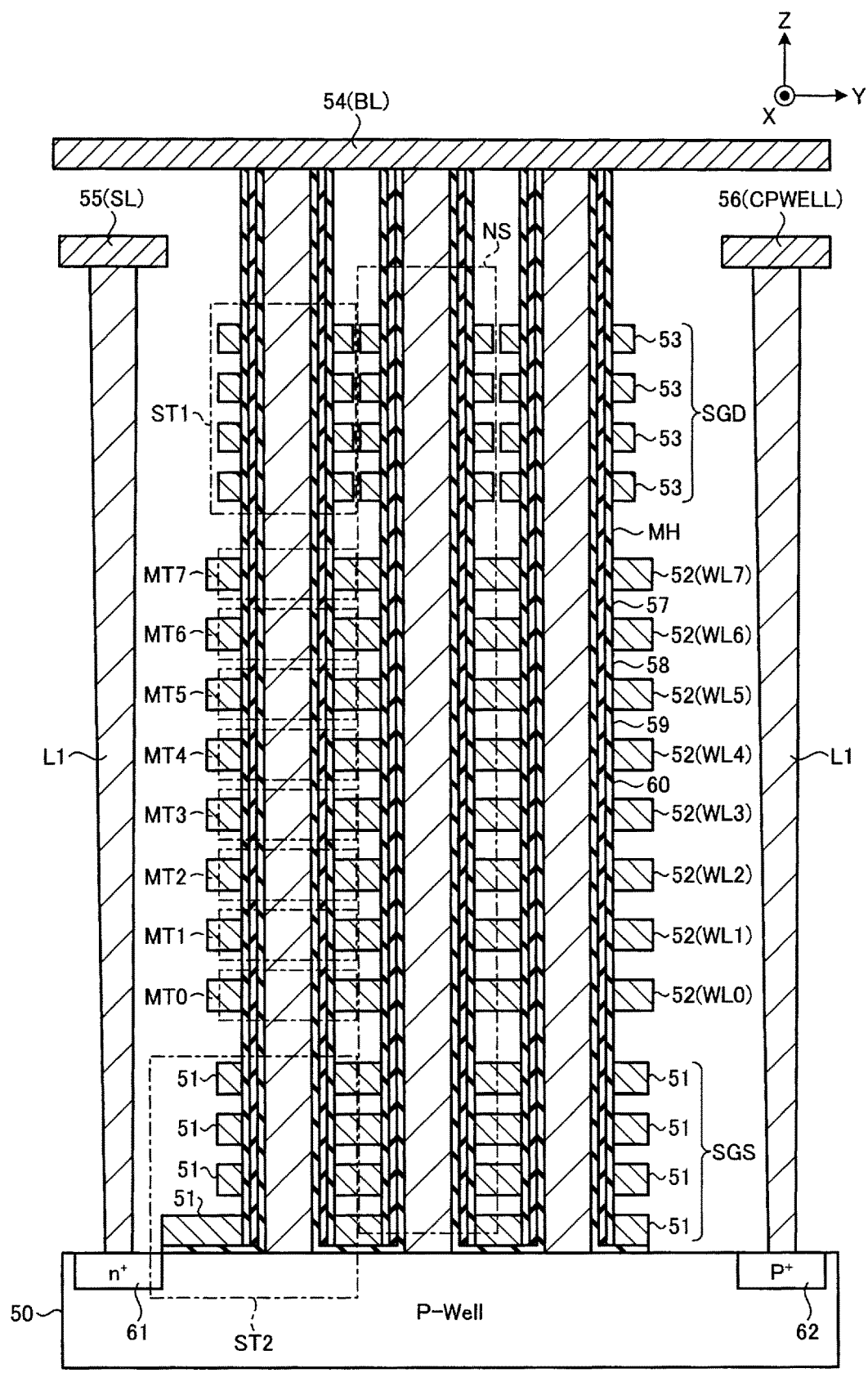
FIG. 4 is a diagram illustrating a cross-section of a memory cell array that may be used according to the first embodiment.

FIG. 4 is a diagram illustrating an example of a section of the memory cell array 11 that may be used according to the first embodiment. As illustrated in FIG. 4, the memory cell array 11 includes a P-type well region 50, wiring layers 51 to 56, a plurality of semiconductor pillars MH, and a plurality of contact plugs LI.

The P-type well region 50 is formed in a surface of a semiconductor substrate. The wiring layers 51 to 53 are sequentially stacked on the P-type well region 50. The wiring layers 51 to 53 respectively function as the select gate lines SGS, the word lines WL, and the select gate lines SGD. In other words, the number of wiring layers 51, the number of wiring layers 52, and the number of wiring layers 53 respectively correspond to the number of the select gate lines SGS, the number of word lines WL, and the number of select gate lines SGD.

The wiring layers 51 and 53 respectively corresponding to the select gate lines SGS and SGD may be provided as a plurality of wiring layers as illustrated in FIG. 4. Each of the wiring layers 51 to 53 has a planar shape spreading in an X direction and a Y direction.

The plurality of semiconductor pillars MH extend to an upper surface of the P-type well region 50 from an upper surface of the wiring layer 53. In other words, the semiconductor pillar MH passes through the wiring layers 51 to 53 along a Z direction. A block insulating film 57, an insulating film (charge storage layer) 58, and a tunnel oxide film 59 are formed in this order on a side surface of the semiconductor pillar MH. A semiconductor material 60 containing a conductive material is buried into the tunnel oxide film 59 in the semiconductor pillar MH.

The wiring layer 54 corresponding to the bit line BL is formed over the wiring layer 53 and the semiconductor pillar MH. The bit line BL is connected to the corresponding semiconductor pillar MH. A contact plug containing a conductive material may be formed between the bit line BL and the corresponding semiconductor pillar MH.

The wiring layers 55 and 56 respectively corresponding to the source line SL and a well line CPWELL are formed between the wiring layers 53 and 54. The source line SL is connected to an n+ impurity diffusion area 61 formed in the surface of the well region 50 via the contact plug LI. The well line CPWELL is connected to a p+ impurity diffusion area 62 formed in the surface of the well region 50 via the contact plug LI. The contact plug LI has a plate shape spreading in the X direction and a Z direction.

In the above configuration, a single semiconductor pillar MH corresponds to a single NAND string NS. Specifically, intersections between the select gate lines SGD and SGS and the semiconductor pillar MH respectively correspond to the select transistors ST1 and ST2. Similarly, an intersection between the word line WL and the semiconductor pillar MH corresponds to the memory cell transistor MT.

The above configuration is arranged in a plurality in the X direction. For example, the single string unit SU is formed by a set of a plurality of NAND strings NS arranged in the X direction. When a plurality of string units SU are provided in the same block BLK, the wiring layers 53 corresponding to the select gate line SGD are separated from each other among the string units SU.

The lowermost wiring layer 51 and the tunnel oxide film 59 are provided near the n+ impurity diffusion area 61. Consequently, when the select transistor ST2 is turned on, a current path is formed between the NAND string NS and the n+ impurity diffusion area 61.

Hereinafter, the memory cell transistor MT will be simply referred to as a memory cell.

Figure 5:
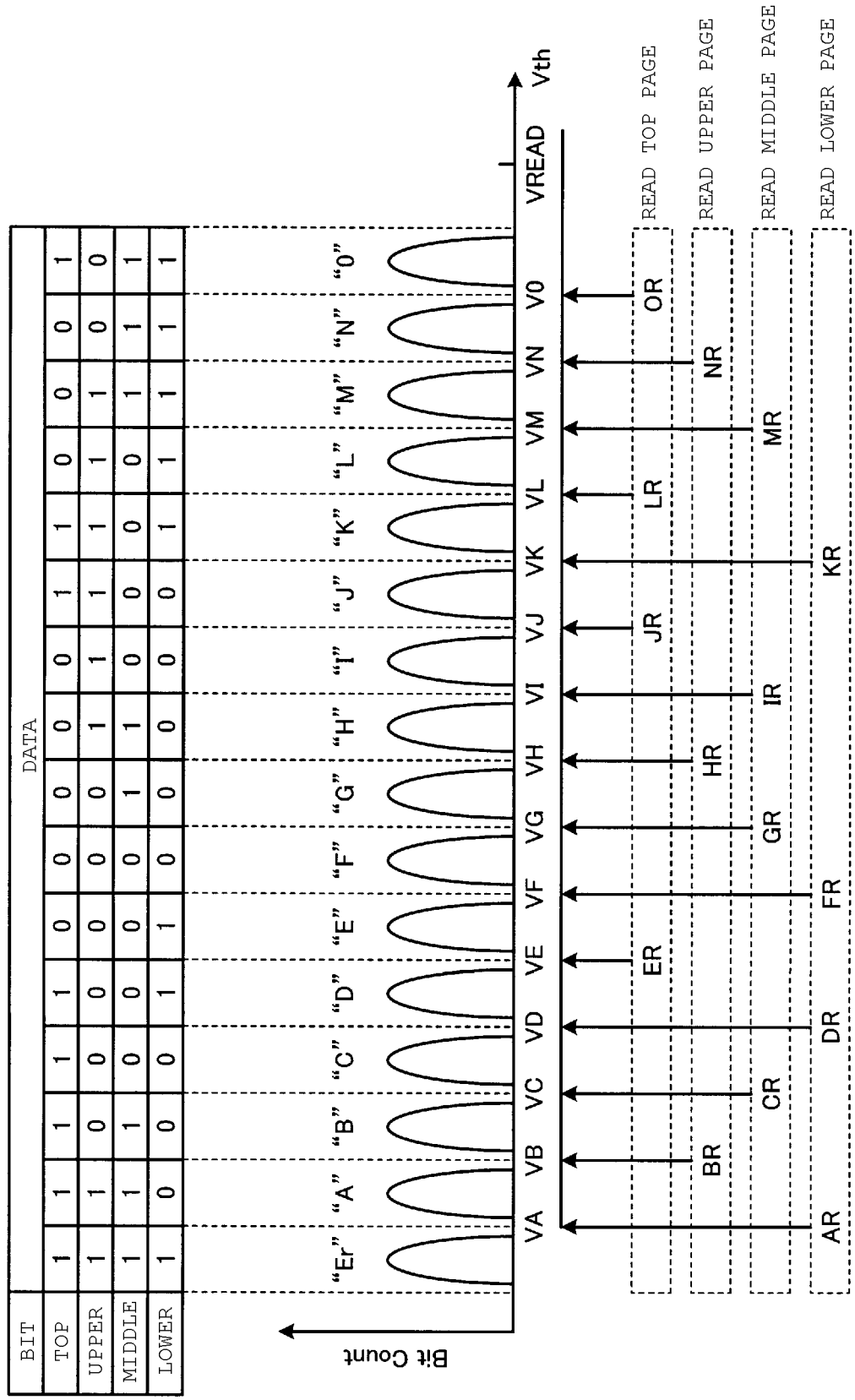
FIG. 5 is a diagram illustrating a distribution of a threshold voltage of each memory cell storing 4-bit data as a result of a write operation in a memory system according to a first embodiment.

As described above, the memory cell can store data of two or more bits. FIG. 5 is a diagram illustrating a distribution of a threshold voltage of each memory cell storing 4-bit data as a result of a write operation in the memory system 1 that may be used according to the first embodiment. In FIG. 5, a horizontal axis expresses a threshold voltage, and a vertical axis expresses the number of memory cells, that is, a bit count.

A threshold voltage of each memory cell has a value in accordance with stored data. When 4 bits are stored in each memory cell, each memory cell may have any one of 16 (e.g., $2^4$) threshold voltages. The memory cell may store data of "1111", data of "1110", data of "1010", data of "1000", data of "1001", data of "0001", data of "0000", data of "0010", data of "0110", data of "0100", data of "1100", data of "1101", data of "0101", data of "0111", data of "0011", and data of "1011" as the 16 threshold voltages. The memory cell storing the data of "1111", the data of "1110", the data of "1010", the data of "1000", the data of "1001", the data of "0001", the data of "0000", the data of "0010", the data of "0110", the data of "0100", the data of "1100", the data of "1101", the data of "0101", the data of "0111", the data of "0011", and the data of "1011" will be referred to as being in Er, A, B, C, D, E, F, G, H, I, J, K, L, M, N, and O states, respectively. The memory cell in the Er state, the A state, the B state, the C state, the D state, the E state, the F state, the G state, the H state, the I state, the J state, the K state, the L state, the M state, the N state, and the O state has a higher threshold voltage in this order.

A plurality of memory cells storing the same 4-bit data may have different threshold voltages due to variations in characteristics of the memory cells. In FIG. 5 and the subsequent drawings, a threshold voltage distribution is represented by a continuous curve, but, in actuality, the number of memory cells is discrete.

In order to identify data stored in a read target memory cell, a state of the memory cell is determined. Read voltages VA, VB, VC, VD, VE, VF, VG, VH, VI, VJ, VK, VL, VM, VN, and VO are used to determine the state of the memory cell. Hereinafter, in addition to the read voltages VA, VB, VC, VD, VE, VF, VG, VH, VI, VJ, VK, VL, VM, VN, and VO, a voltage with a certain magnitude applied to a read target memory cell in order to determine a state of the memory cell will be referred to as a read voltage VCGR. In other words, a plurality of read voltages (herein, fifteen) are prepared to determine data stored in a memory cell.

The read voltage VA is higher than the highest threshold voltage of a memory cell in the Er state and is lower than the lowest threshold voltage of a memory cell in the A state right after data is written.

The read voltage VB is higher than the highest threshold voltage of a memory cell in the A state right after data is written and is lower than the lowest threshold voltage of a memory cell in the B state right after data is written.

The read voltage VC is higher than the highest threshold voltage of a memory cell in the B state right after data is written and is lower than the lowest threshold voltage of a memory cell in the C state right after data is written.

The read voltage VD is higher than the highest threshold voltage of a memory cell in the C state right after data is written and is lower than the lowest threshold voltage of a memory cell in the D state right after data is written.

The read voltage VE is higher than the highest threshold voltage of a memory cell in the D state right after data is written and is lower than the lowest threshold voltage of a memory cell in the E state right after data is written.

The read voltage VF is higher than the highest threshold voltage of a memory cell in the E state right after data is written and is lower than the lowest threshold voltage of a memory cell in the F state right after data is written.

The read voltage VG is higher than the highest threshold voltage of a memory cell in the F state right after data is written and is lower than the lowest threshold voltage of a memory cell in the G state right after data is written.

The read voltage VH is higher than the highest threshold voltage of a memory cell in the G state right after data is written and is lower than the lowest threshold voltage of a memory cell in the H state right after data is written.

The read voltage VI is higher than the highest threshold voltage of a memory cell in the H state right after data is written and is lower than the lowest threshold voltage of a memory cell in the I state right after data is written.

The read voltage VJ is higher than the highest threshold voltage of a memory cell in the I state right after data is written and is lower than the lowest threshold voltage of a memory cell in the J state right after data is written.

The read voltage VK is higher than the highest threshold voltage of a memory cell in the J state right after data is written and is lower than the lowest threshold voltage of a memory cell in the K state right after data is written.

The read voltage VL is higher than the highest threshold voltage of a memory cell in the K state right after data is written and is lower than the lowest threshold voltage of a memory cell in the L state right after data is written.

The read voltage VM is higher than the highest threshold voltage of a memory cell in the L state right after data is written and is lower than the lowest threshold voltage of a memory cell in the M state right after data is written.

The read voltage VN is higher than the highest threshold voltage of a memory cell in the M state right after data is written and is lower than the lowest threshold voltage of a memory cell in the N state right after data is written.

The read voltage VO is higher than the highest threshold voltage of a memory cell in the N state right after data is written and is lower than the lowest threshold voltage of a memory cell in the O state right after data is written.

A read operation using a read voltage VX (where X is A, B, C, D, E, F, G, H, I, J, K, L, M, N, or O) will be referred to as an X read operation. As in the X read operation, a process of sensing a state of a memory cell by using a single read voltage will be referred to as a single-state read operation. Read data obtained through the X read operation will be referred to as read data XR.

A range including a threshold voltage of a read target memory cell (also referred to as a selected memory cell) is used to index a state of the memory cell. In order to index a range of a threshold voltage of a selected memory cell, it is determined whether the threshold voltage of the selected memory cell exceeds a certain read voltage VCGR. A memory cell having a threshold voltage equal to or higher than the read voltage VCGR is off even when the read voltage VCGR is applied to a control gate thereof. On the other hand, a memory cell having a threshold voltage lower than the read voltage VCGR is turned on when the read voltage VCGR is applied to a control gate thereof. A voltage VREAD is applied to the word line WL of a non-read target memory cell, and is higher than a threshold voltage of a memory cell in a certain state.

Among 4-bit data values stored in a single memory cell, the highest (first digit) bit will be referred to as a top bit, a second digit bit will be referred to as an upper bit, a third digit bit will be referred to as a middle bit, and a fourth digit bit will be referred to as a lower bit. A set of top bits of memory cells connected to the same word line WL will be referred to as a top page. A set of upper bits of memory cells connected to the same word line WL will be referred to as an upper page. A set of middle bits of memory cells connected to the same word line WL will be referred to as a middle page. A set of lower bits of memory cells connected to the same word line WL will be referred to as a lower page.

Data of each page is calculated by using a plurality of read voltages among the fifteen read voltages. An example thereof will be described below.

With respect to a lower bit, when it is determined that a threshold voltage of a selected memory cell storing data of the bit is in a range lower than the read voltage VA, a range equal to or higher than the read voltage VD and lower than the read voltage VF, or a range equal to or higher than the read voltage VK, data of the lower bit is determined as being data of a value equal to "1". On the other hand, when it is determined that a threshold voltage of a selected memory cell storing data of the bit is in a range equal to or higher than the read voltage VA and lower than the read voltage VD, or a range equal to or higher than the read voltage VF and lower than the read voltage VK, data of the lower bit is determined as being data of a value equal to "0". In order to determine a state of a selected memory cell, the read voltage VCGR corresponding to a boundary between a state from which data of a value equal to "0" is determined and a state from which data of a value equal to "1" is determined is used. When a lower page is read, for example, an A read operation, a D read operation, an F read operation, and a K read operation are used. A state of a selected memory cell may be determined through logical calculation among read data AR, read data DR, read data FR, and read data KR.

This is also the same for other pages. Middle page data is calculated by using, for example, a C read operation, a G read operation, an I read operation, and an M read operation. Upper page data is calculated by using, for example, a B read operation, an H read operation, and an N read operation. Top page data is calculated by using, for example, an E read operation, a J read operation, an L read operation, and an 0 read operation.

Hereinafter a plurality of read operations required to index data stored in a certain page will be referred to as boundary read operations required for the page. For example, in indexing a lower page, the A read operation, the D read operation, the F read operation, and the K read operation are executed as boundary read operations.

A process of calculating data on the basis of results in boundary read operations is executed by the sense amplifier module 12.

Figure 6:
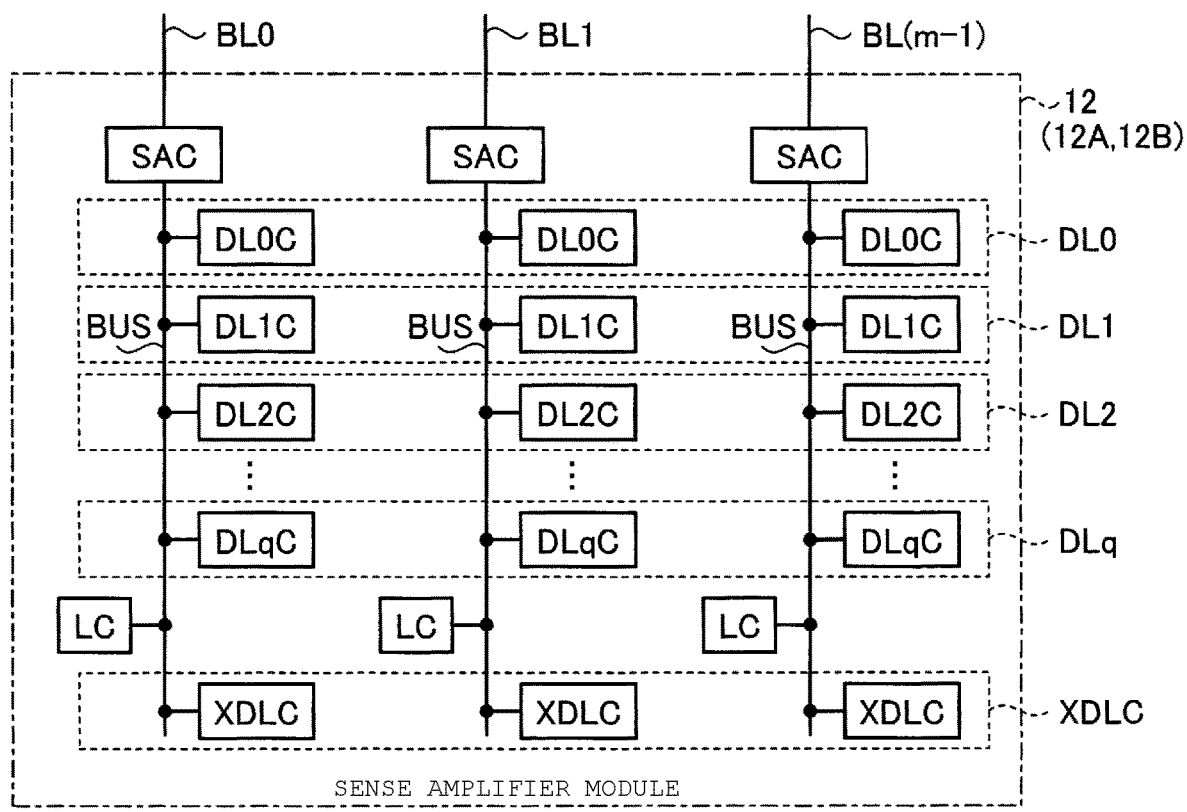
FIG. 6 is a diagram illustrating aspects of a sense amplifier module in a memory system according to a first embodiment.

FIG. 6 is a diagram illustrating elements and connection in the sense amplifier module 12 that may be used in a memory system according to the first embodiment. The sense amplifier module 12 includes m sense amplifier circuits SAC, a plurality of data latches DL (DL0, DL1, DL2, DLq (where q is a natural number)), m calculation circuits LC, and a single data latch XDLC. A data latch DLi (where i is 0 to q) includes m data latch circuits DLiC. The data latch XDLC includes m data latch circuits XDLC. The data latch circuits DLC and XDLC temporarily store data.

Each bit line BL is connected to a single sense amplifier circuit SAC, (q+1) data latch circuits DL0C, DL1C, DL2C, . . . DLqC, a single calculation circuit LC, and a single data latch circuit XDLC.

Each sense amplifier circuit SAC is electrically connected to a single selected memory cell via the single bit line BL connected to the sense amplifier circuit SAC during reading of data. Each sense amplifier circuit SAC senses a voltage with a magnitude that is defined on the basis of a threshold voltage of the selected memory cell, on a node of the sense amplifier circuit SAC, and determines in which of two states the memory cell electrically connected to the sense amplifier circuit SAC is on the basis of a sensing result. The two states of the memory cell are expressed as data of "0" and data of "1", and each sense amplifier circuit SAC stores information as to whether read data is data of "0" or data of "1" in any one data latch circuit DLC connected to the sense amplifier circuit SAC.

The calculation circuit LC performs logical calculation on data in the data latch circuits DLC and XDLC connected to the calculation circuit LC. The logical calculation includes NOT calculation, OR calculation, AND calculation, XOR calculation, and XNOR calculation.

For example, when a read target page is a lower page, four boundary read operations, that is, the A read operation, the D read operation, the F read operation, and the K read operation are executed. The sense amplifier circuit SAC may store four sensing results (sensing values) obtained through the four boundary read operations in different data latch circuits DLC. The four sensing results are, for example, the read data AR, the read data DR, and the read data FR, and the read data KR. The calculation circuit LC acquires data of the lower page by performing various logical calculations on the basis of the read data AR, the read data DR, and the read data FR, and the read data KR stored in the different data latch circuits DLC, and stores the acquired data of the lower page into the data latch XDLC.

Each threshold voltage distribution may change with the passage of time or for each access.

Figure 7:
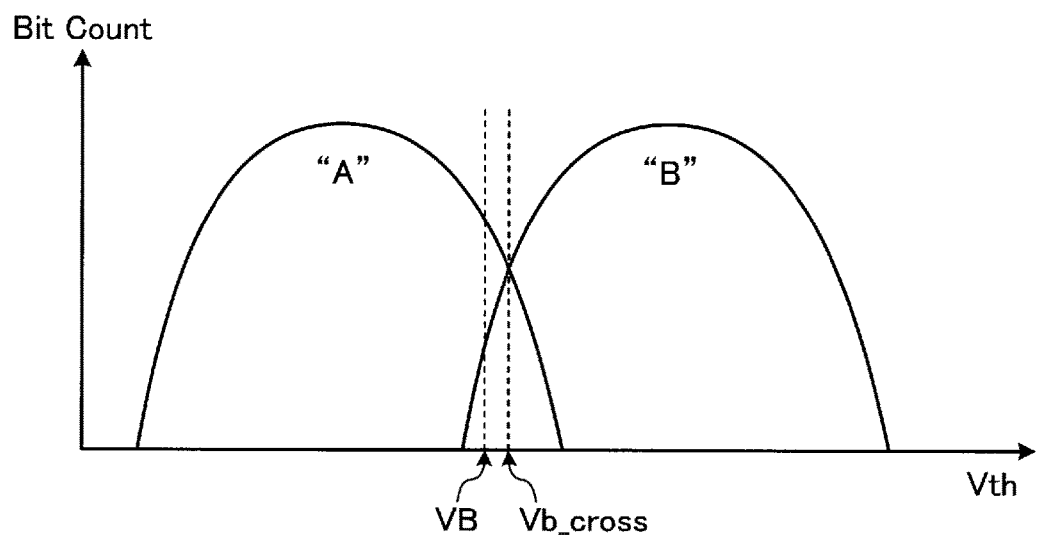
FIG. 7 is a diagram illustrating an example of a threshold voltage distribution after being changed.

FIG. 7 is a diagram illustrating an example of each threshold voltage distribution after being changed. FIG. 7 illustrates only the A state and the B state for simplification of description. A tail of a threshold voltage distribution in the A state and a tail of a threshold voltage distribution in the B state overlap each other. In other words, the maximum value of the A state is greater than the read voltage VB, and the minimum value of the B state is less than the read voltage VB. When a threshold voltage is in the A state, and data is read from a memory cell of which a threshold voltage is higher than the read voltage VB, the threshold voltage of the memory cell is recognized to be in the B state. In other words, data that is programmed as "1110" is read as "1010". When a threshold voltage is in the B state, and data is read from a memory cell of which a threshold voltage is lower than the read voltage VB, the threshold voltage of the memory cell is recognized to be in the A state. In other words, data that is programmed as "1010" is read as "1110". Data that changes from the time of programming is detected as an error by the ECC circuit 23, and is thereby attempted to be corrected via an error correction operation.

However, there is an upper limit in correction performance of the ECC circuit 23. The memory controller 20 may shift a read voltage used in a boundary read operation in order to reduce the number of bits (hereinafter, the number of errors) detected as errors as much as possible. The memory controller 20 estimates a value of a read voltage minimizing the number of errors for each read voltage used in a boundary read operation. A process of estimating a read voltage minimizing the number of errors will be referred to as an estimation process. A read voltage minimizing the number of errors will be referred to as an optimal read voltage.

In FIG. 7, when a voltage Vb_cross at a cross point between the threshold voltage distribution in the A state and the threshold voltage distribution in the B state is used as a read voltage, a total number including the number of errors in which the data "1110" is read as the data "1010" and the number of errors in which "1010" is read as the data "1110" is minimized. In other words, the voltage Vb_cross is an optimal read voltage in the B read operation. Hereinafter, an optimal read voltage in an X read operation will be indicated by VX' (where X is A, B, C, D, E, F, G, H, I, J, K, L, M, N, or O).

The memory controller 20 may estimate each optimal read voltage, and may instruct the memory chip 10 to perform a read operation using an estimated value of each optimal read voltage. An estimated value of each optimal read voltage need not necessarily match each optimal read voltage. The memory chip 10 performs a read operation on the memory cell array 11 by using an estimated value of each optimal read voltage that is set from the memory controller 20. Hereinafter, unless otherwise mentioned, an estimated value of an optimal read voltage will be simply referred to as an optimal read voltage. A read operation executed by shifting each read voltage used in a boundary read operation will be referred to as a shift read operation.

The memory controller 20 may execute an estimation process at any timing. The memory controller 20 may start the estimation process with any timing as a trigger. In the present embodiment, as an example, the memory controller 20 executes the estimation process when an error correction operation performed by the ECC circuit 23 fails.

Next, a description will be made of a concept of the estimation process.

Figure 8:
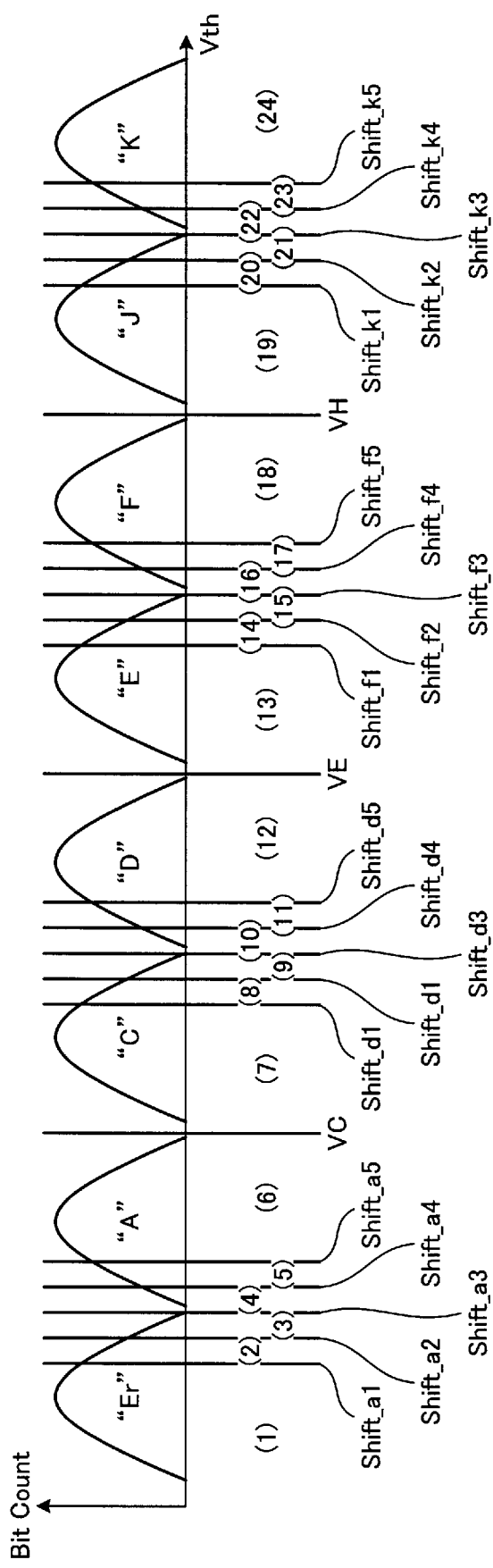
FIG. 8 is a diagram illustrating various read voltages used for a lower estimation process according to a first embodiment.
Figure 10:
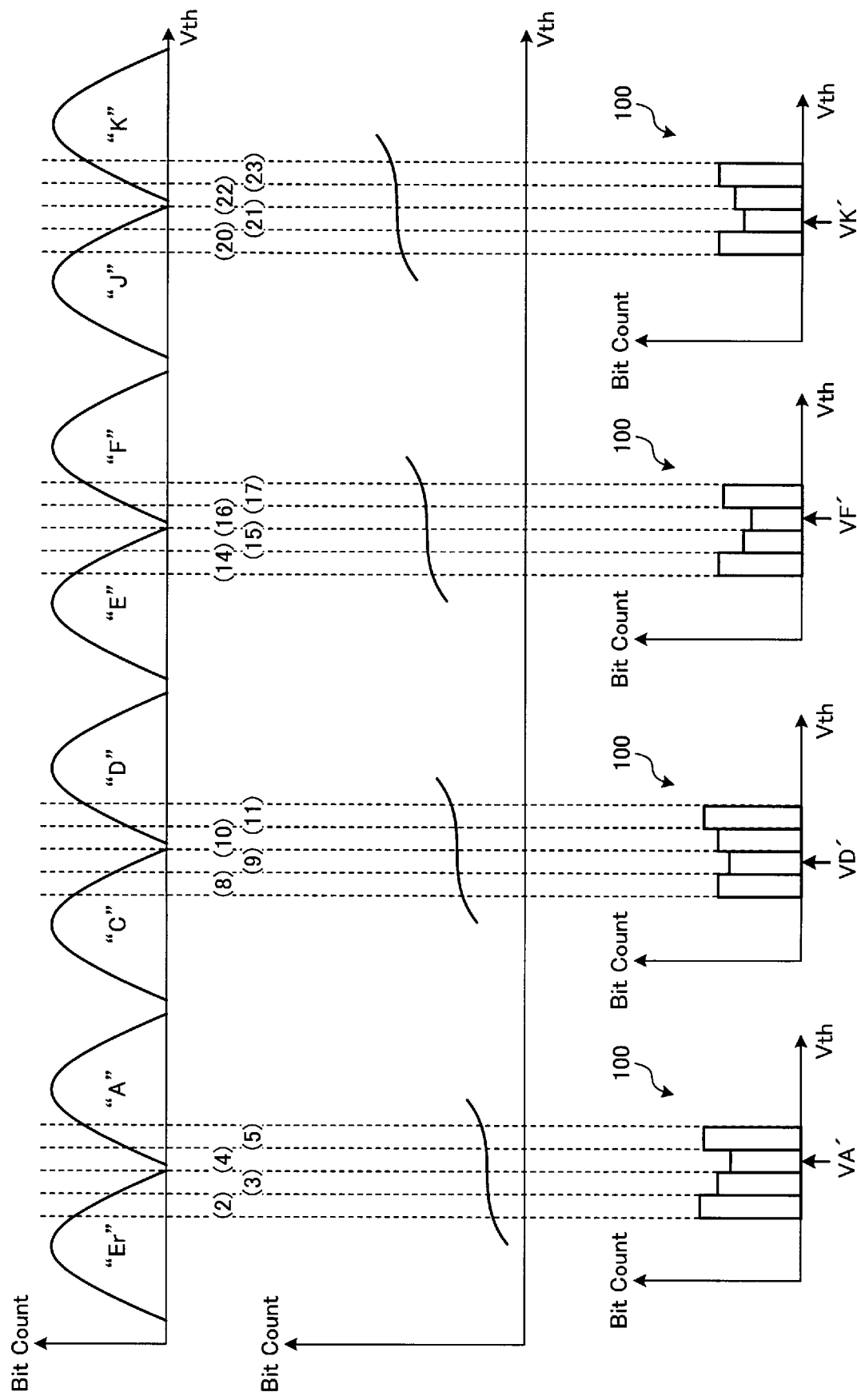
FIG. 10 is a diagram illustrating histograms generated in the lower estimation process, according to a first embodiment.

A description will be made of the estimation process of estimating each read voltage according to a first embodiment, with reference to FIGS. 8, 9, and 10. In FIGS. 8, 9, and 10, as an example, a description will be made of a process of estimating respective read voltages used in a read operation on a lower page, that is, optimal values of the read voltages VA, VD, VF, and VK. The process of estimating respective read voltages used in a read operation on a lower page will be referred to as a lower estimation process.

In the lower estimation process, a plurality of shift read operations are executed by changing (shifting) the respective read voltages. Each shift read operation included in the lower estimation process is the same as a normal read operation performed on a lower page, and is, specifically, a process of determining data of a lower bit by executing the A read operation, the D read operation, the F read operation, and the K read operation. However, the read voltages VA, VD, VF, and VK are shifted in each of a plurality of shift read operations.

FIG. 8 illustrates various read voltage VCGR used in the lower estimation process. In the example illustrated in FIG. 8, five shift read operations are executed. Each of the five shift read operations is indicated by SFTx (where x is an integer of 1 to 5). In the shift read operation SFTx, Shift_ax is used as the read voltage VA, Shift_dx is used as the read voltage VD, Shift_fx is used as the read voltage VF, and Shift_kx is used as the read voltage VK.

In the first embodiment, as an example, it is assumed that, in a single shift read operation, the respective read voltages VA, VD, VF, and VK are shifted by the same amount from reference values of the read voltages VA, VD, VF, and VK. Hereinafter, unless otherwise mentioned, a shift amount indicates a shift amount from a reference value. An interval among shift amounts applied to five shift read operations is assumed to be at an equal interval in this example.

In the lower estimation process, a read operation for acquiring mask data is executed in addition to the shift read operation. Read data in the shift read operation is generated through calculation using sensing results in a plurality of single-state read operations. The mask data is used to separate a sensing result in each of the single-state read operations from the read data in the shift read operation. A read operation for acquiring the mask data will be referred to as a mask data read operation.

In the mask data read operation, a specific voltage is applied to the selected word line WL. The specific voltage is a voltage between two estimation target optimal read voltages adjacent to each other. For example, a voltage sufficiently separated from the two estimation target optimal read voltages adjacent to each other is used as the specific voltage. In other words, among the four read voltages VA, VD, VF, and VK for determining a lower bit, a voltage set between a certain first read voltage and a second read voltage that is next highest in voltage level to the first read voltage is used as the specific voltage.

The read voltages VA, VD, VF, and VK are used in a lower page read operation. Therefore, in the lower estimation process, in an example, the C read operation, the E read operation, and the H read operation are executed as the mask data read operations. In other words, a sensing result CR in the C read operation, a sensing result ER in the E read operation, and a sensing result HR in the H read operation are used as mask data.

In the lower estimation process, the range in which a threshold voltage of each memory cell can be present is divided into a total of 24 segments (labeled (1) to (24) in FIG. 8) by the respective read voltages used in the five shift read operations, the read voltage VC (used in the C read operation), the read voltage VE (used in the E read operation), and the read voltage VH (used in the H read operation).

FIG. 9 illustrates, for each segment ((1) to (24)), data values obtained through five shift read operations (SFT1 to SFT5), and sensing results in the C read operation, the E read operation, and the H read operation.

The sensing result CR in the C read operation related to a certain memory cell being "1 (the memory cell is in an ON state)" indicates that a threshold voltage of the memory cell is in one of the segments (herein, the segments (1) to (6)) near a boundary between the Er state and the A state. The sensing result CR in the C read operation related to a certain memory cell being "0 (the memory cell is in an OFF state)" indicates that a threshold voltage of the memory cell is not in the segments (1) to (6). In other words, read data in the five shift read operations is masked by using the sensing result CR in the C read operation, and thus memory cells with threshold voltage in the segments (1) to (6) can be separated from memory cells with threshold voltage not in the segments (1) to (6).

In the segments (1) to (6), it is determined whether or not read data obtained through the shift read operation is "1" on the basis of only the sensing result AR in the A read operation. When the sensing result AR in the A read operation is "1 (a memory cell is in an ON state)", read data is treated as "1". When the sensing result AR in the A read operation is "0 (a memory cell is in an OFF state)", read data is treated as "0".

Therefore, in an example, read data obtained through the respective shift read operations (SFT1 to SFT5) is subjected to an AND calculation with the sensing result CR from the C read operation, and thus the sensing result AR from the A read operation can be acquired from the read data obtained through SFT1 to SFT5.

The sensing result CR in the C read operation for a memory cell being "0 (the memory cell is in an OFF state)" and the sensing result ER from the E read operation related to the memory cell being "1 (the memory cell is in an ON state)" indicate that a threshold voltage of the memory cell is in segments (segments (7) to (12)) near a boundary between the C state and the D state. The sensing result CR from the C read operation for a memory cell not being "0 (the memory cell is in an OFF state)" or the sensing result ER in the E read operation related to the memory cell not being "1 (the memory cell is in an ON state)" indicates that a threshold voltage of the memory cell is not in the segments (7) to (12). In other words, read data in the five shift read operations is masked by using an XOR calculation (CR XOR ER) between the sensing result CR in the C read operation and the sensing result ER in the E read operation, and thus a memory cell for which a threshold voltage is in the segments (7) to (12) can be separated from a memory cell for which a threshold voltage is not in the segments (7) to (12).

In the segments (7) to (12), it is determined whether or not read data obtained through the shift read operation is "1" on the basis of only the sensing result DR in the D read operation. When the sensing result DR in the D read operation is "1 (a memory cell is in an ON state)", read data is treated as "0". When the sensing result DR in the D read operation is "0 (a memory cell is in an OFF state)", read data is treated as "1".

Therefore, in an example, read data obtained through the respective shift read operations (SFT1 to SFT5) is subjected to an AND calculation with the result of an XOR calculation (CR XOR ER) between the sensing result CR and the sensing result ER, and then the result of the AND calculation is inverted, so that the sensing result DR from the D read operation can be acquired from the read data obtained through SFT1 to SFT5.

The sensing result ER from the E read operation related to a memory cell being "0 (the memory cell is in an OFF state)" and the sensing result HR in the H read operation related to the memory cell being "1 (the memory cell is in an ON state)" indicate that a threshold voltage of the memory cell is in segments (segments (13) to (18)) near a boundary between the E state and the F state. The sensing result ER in the E read operation related to a memory cell not being "0 (the memory cell is in an OFF state)" or the sensing result HR in the H read operation related to the memory cell not being "1 (the memory cell is in an ON state)" indicates that a threshold voltage of the memory cell is not in the segments (13) to (18). In other words, read data in the five shift read operations is masked by using an XOR calculation (ER XOR HR) between the sensing result ER and the sensing result HR, and thus a memory cell for which a threshold voltage is in the segments (13) to (18) can be separated from a memory cell for which a threshold voltage is not in the segments (13) to (18).

In the segments (13) to (18), it is determined whether or not read data obtained through the shift read operation is "1" on the basis of only the sensing result FR from the F read operation. When the sensing result FR in the F read operation is "1 (a memory cell is in an ON state)", read data is treated as "1". When the sensing result FR in the F read operation is "0 (a memory cell is in an OFF state)", read data is treated as "0".

Therefore, in an example, read data obtained through the respective shift read operations (SFT1 to SFT5) is subjected to an AND calculation with a result of an XOR calculation (ER XOR HR) between the sensing result ER and the sensing result HR, and thus the sensing result FR in the F read operation can be acquired from the read data obtained through SFT1 to SFT5.

The sensing result HR in the H read operation related to a memory cell being "0 (the memory cell is in an OFF state)" indicates that a threshold voltage of the memory cell is in segments (herein, the segments (19) to (24)) near a boundary between the J state and the K state. The sensing result HR in the H read operation related to a certain memory cell being "1 (the memory cell is in an ON state)" indicates that a threshold voltage of the memory cell is not in the segments (19) to (24). In other words, read data in the five shift read operations is masked by using the sensing result HR in the H read operation, and thus a memory cell for which a threshold voltage is in the segments (19) to (24) can be separated from a memory cell for which a threshold voltage is not in the segments (19) to (24).

In the segments (19) to (24), it is determined whether or not read data obtained through the shift read operation is "1" on the basis of only the sensing result KR in the K read operation. When the sensing result KR in the K read operation is "1 (a memory cell is in an ON state)", read data is treated as "0". When the sensing result KR in the K read operation is "0 (a memory cell is in an OFF state)", read data is treated as "1".

Therefore, in an example, read data obtained through the respective shift read operations (SFT1 to SFT5) is subjected to an AND calculation with an inversion of the sensing result HR, and the result of the AND calculation is inverted, and thus the sensing result KR for the K read operation can be acquired from the read data obtained through SFT1 to SFT5.

Hereinafter, each sensing result XR separated from read data from a shift read operation by using mask data will be referred to as separated data XR. The voltage(s) used as a read voltage in the shift read operation will be referred to as a shift read voltage in some cases. The sensing result XR as separated data obtained through a shift read operation SFTi will be referred to as a sensing result XRi or separated data XRi in some cases.

A plurality of memory cells belonging to the target word line WL are classified by respective segments on the basis of separated data in each shift read operation. The number of memory cells classified as being in each segment is counted for each segment. Counting for each segment is executed as follows, for example. Memory cells having different values between two portions of separated data obtained through two shift read operations executed by using shift read voltages on both sides of a certain segment are counted. A result obtained through counting corresponds to the number of memory cells classified as being in the segment.

For example, the number of "1s (indicating memory cells in an ON state)" included in each of a sensing result ARi as separated data obtained through a shift read operation using Shift_ai and a sensing result AR(i+1) as separated data obtained through a shift read operation using Shift_a(i+1) is counted. This process corresponds to counting the number of memory cells having entered an ON state when Shift_ai is used as a read voltage and the number of memory cells having entered an ON state when Shift_a (i+1) is used as a read voltage. After the counting, a difference between the number of "1s" included in the sensing result ARi and the number of "1s" included in the sensing result AR(i+1) is calculated, and the calculated difference corresponds to the number of memory cells classified as being in a segment between Shift_ai and Shift_a(i+1). The number of memory cells turned off may instead be counted in other examples.

Consequently, a histogram is constructed in which the number of memory cells is indicated by frequency for each segment of a threshold voltage range.

FIG. 10 is a diagram illustrating examples of histograms generated in the lower estimation process. An upper graph is a graph showing threshold voltage distributions, a middle graph is a graph showing the number of memory cells turned on when the respective shift read voltages are applied, and the lower graphs are histograms.

As illustrated in FIG. 10, in the lower estimation process, respective histograms for the read voltages VA, VD, VF, and VK are generated. The histograms correspond to the threshold voltage distributions. Therefore, in the respective histograms, the optimal read voltages VA', VD', VF', and VK' can be separately estimated on the basis of segments for which the frequency (bit count) is the minimum value. For example, an estimated value of an optimal read voltage can be calculated according to an internal division ratio between frequencies in two segments adjacent to the segment in which the frequency is the minimum value. An optimal read voltage calculation method is not limited the above example.

A process of estimating a read voltage to be used in each read operation on a middle page, an upper page, and a top page can be executed according to a method similar to the lower estimation process. The process of estimating a read voltage to be used in each read operation on a middle page, an upper page, and a top page will be described briefly.

A process of estimating each read voltage used in a read operation on a middle page will be referred to as a middle estimation process. The middle estimation process is executed as follows.

In the middle estimation process, in the same manner as in the lower estimation process, a plurality of shift read operations are executed by changing (shifting) the respective read voltages. Each shift read operation included in the middle estimation process is the same as a normal read operation performed on a middle page, and is, specifically, a process of determining data of a middle bit by executing the C read operation, the G read operation, the I read operation, and the M read operation. However, the read voltages VC, VG, VI, and VM are shifted in each of a plurality of shift read operations.

Figure 11:
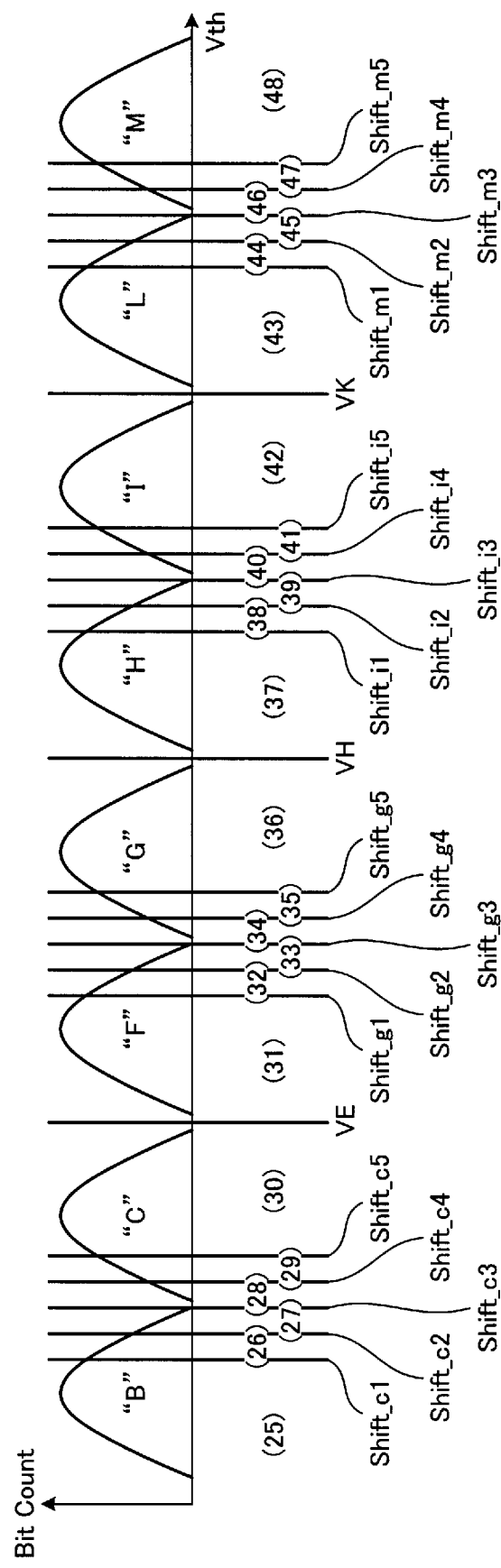
FIG. 11 is a diagram illustrating various read voltages used for a middle estimation process, according to a first embodiment.

FIG. 11 illustrates various read voltage VCGR used in the middle estimation process. In the example illustrated in FIG. 11, five shift read operations are executed. Each of the five shift read operations is indicated by SFTx (where x is an integer of 1 to 5). In the shift read operation SFTx, Shift_cx is used as the read voltage VC, Shift_gx is used as the read voltage VG, Shift_ix is used as the read voltage VI, and Shift mx is used as the read voltage VM.

In the middle estimation process, for example, the E read operation, the H read operation, and the K read operation are executed as mask data read operations. In other words, a sensing result ER from the E read operation, a sensing result HR from the H read operation, and a sensing result KR from the K read operation are used as mask data.

In the middle estimation process, the range in which a threshold voltage of each memory cell can be present is divided into a total of 24 segments (labeled (25) to (48) in FIG. 11) by the respective read voltages used in the five shift read operation, the read voltage VE, the read voltage VH, and the read voltage VK.

FIG. 12 illustrates, for each segment, data values obtained through five shift read operations (SFT1 to SFT5) and sensing results in the E read operation, the H read operation, and the K read operation in the middle estimation process. With reference to FIG. 12, a description will be made of a method of acquiring separated data in the middle estimation process.

The sensing result ER in the E read operation related to a certain memory cell being "1 (the memory cell is in an ON state)" indicates that a threshold voltage of the memory cell is in segments (segments (25) to (30)) near a boundary between the B state and the C state. In the segments (25) to (30), it is determined whether or not read data obtained through the shift read operation is "1" on the basis of only the sensing result CR in the C read operation. When the sensing result CR in the C read operation is "1 (a memory cell is in an ON state)", read data is treated as "1". When the sensing result CR in the C read operation is "0 (a memory cell is in an OFF state)", read data is treated as "0".

Therefore, in an example, read data obtained through the respective shift read operations (SFT1 to SFT5) is subjected to an AND calculation with the sensing result ER, and thus the sensing result CR for the C read operation can be acquired as separated data from the read data obtained through SFT1 to SFT5.

The sensing result ER in the E read operation related to a memory cell being "0 (the memory cell is in an OFF state)" and the sensing result HR in the H read operation related to the memory cell being "1 (the memory cell is in an ON state)" indicate that a threshold voltage of the memory cell is in segments (segments (31) to (36)) near a boundary between the F state and the G state. In the segments (31) to (36), it is determined whether or not read data obtained through the shift read operation is "1" on the basis of only the sensing result GR from the G read operation. When the sensing result GR in the G read operation is "1 (a memory cell is in an ON state)", read data is treated as "0". When the sensing result GR in the G read operation is "0 (a memory cell is in an OFF state)", read data is treated as "1".

Therefore, read data obtained through the respective shift read operations (SFT1 to SFT5) can be subjected to an AND calculation with a result of an XOR calculation (ER XOR HR) between the sensing result ER and the sensing result HR, and then the result of the AND calculation is inverted, so that the sensing result GR for the G read operation can be acquired as separated data from the read data obtained through SFT1 to SFT5.

The sensing result HR in the H read operation related to a memory cell being "0 (the memory cell is in an OFF state)" and the sensing result KR in the K read operation related to the memory cell being "1 (the memory cell is in an ON state)" indicates that a threshold voltage of the memory cell is in segments (segments (37) to (42)) near a boundary between the H state and the I state. In the segments (37) to (42), it is determined whether or not read data obtained through the shift read operation is "1" on the basis of only the sensing result IR from the I read operation. When the sensing result IR in the I read operation is "1 (a memory cell is in an ON state)", read data is treated as "1". When the sensing result IR in the I read operation is "0 (a memory cell is in an OFF state)", read data is treated as "0".

Therefore, in an example, read data obtained through the respective shift read operations (SFT1 to SFT5) is subjected to AND calculation with a result of XOR calculation (HR XOR KR) between the sensing result HR and the sensing result KR, and thus the sensing result IR for the I read operation can be acquired as separated data from the read data obtained through SFT1 to SFT5.

The sensing result KR in the K read operation related to a memory cell being "0 (the memory cell is in an OFF state)" indicates that a threshold voltage of the memory cell is in segments (segments (43) to (48)) near a boundary between the L state and the M state. In the segments (43) to (48), it is determined whether or not read data obtained through the shift read operation is "1" on the basis of only the sensing result MR from the M read operation. When the sensing result MR from the M read operation is "1 (a memory cell is in an ON state)", read data is treated as "0". When the sensing result MR from the M read operation is "0 (a memory cell is in an OFF state)", read data is treated as "1".

Therefore, in an example, read data obtained through the respective shift read operations (SFT1 to SFT5) is subjected to an AND calculation with an inversion of the sensing result KR from the K read operation, and then the result of the AND calculation is inverted, thus the sensing result MR for the M read operation can be acquired as separated data from the read data obtained through SFT1 to SFT5.

Also in the middle estimation process, according to the same procedure as in the lower estimation process, the number of "1s (indicating memory cells in an ON state)" included in each piece of the separated data CR, GR, IR, MR is counted, and histograms related to the respective read voltages VC, VG, VI, and VM are generated on the basis of counting results. Optimal read voltages VC', VG', VI', and VM' can be separately estimated on the basis of the histograms related to the read voltages VC, VG, VI, and VM.

Next, a description will be made of a process of estimating each read voltage used in a read operation on an upper page. A process of estimating each read voltage used in a read operation on an upper page will be referred to as an upper estimation process. The upper estimation process is executed as follows.

In the upper estimation process, in the same manner as in the lower estimation process or the middle estimation process, a plurality of shift read operations are executed by changing (shifting) the respective read voltages. Each shift read operation included in the upper estimation process is the same as a normal read operation performed on an upper page, and is, specifically, a process of determining data of an upper bit by executing the B read operation, the H read operation, and the N read operation. However, the read voltages VB, VH, and VN are shifted in each of a plurality of shift read operations.

Figure 13:
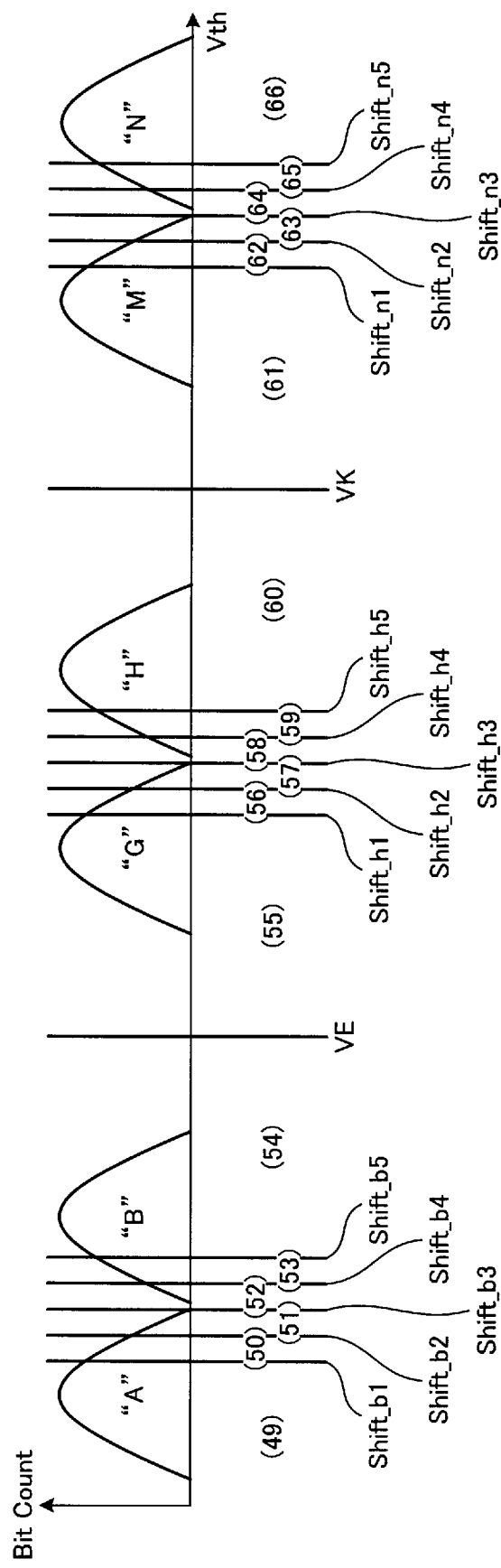
FIG. 13 is a diagram illustrating various read voltages used for an upper estimation process, according to a first embodiment.

FIG. 13 illustrates various read voltage VCGR used in the upper estimation process. In the example illustrated in FIG. 13, five shift read operations are executed. Each of the five shift read operations is indicated by SFTx (where x is an integer of 1 to 5). In the shift read operation SFTx, Shift_bx is used as the read voltage VB, Shift_hx is used as the read voltage VH, and Shift_nx is used as the read voltage VN.

In the upper estimation process, for example, the E read operation and the K read operation are executed as mask data read operations. In other words, a sensing result ER from the E read operation and a sensing result KR from the K read operation are used as mask data.

In the upper estimation process, a range in which a threshold voltage of each memory cell can be present is divided into a total of 18 segments (labeled (49) to (66) in FIG. 13) by the respective read voltages used in the five shift read operation, the read voltage VE used in the E read operation and the read voltage VK used in the K read operation.

Figures 14, 15:
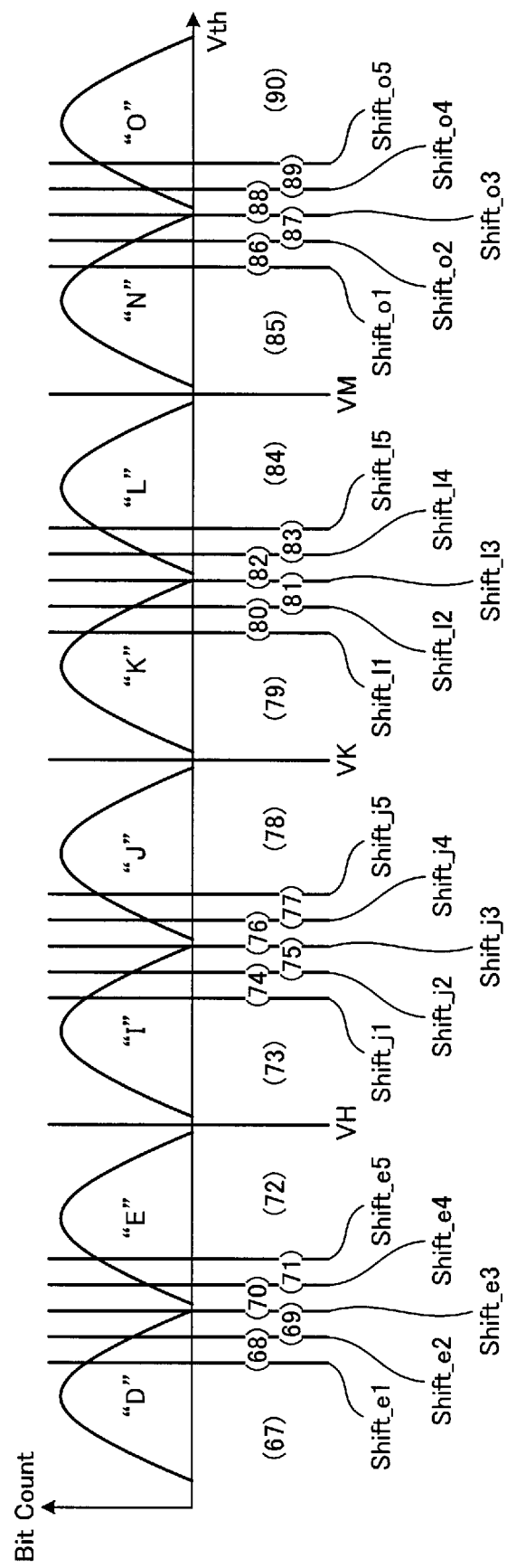
FIG. 14 is a diagram illustrating, for different segments, data values obtained through five shift read operations in the upper estimation process, and sensing results in an E read operation and a K read operation, according to a first embodiment.
FIG. 15 is a diagram illustrating various read voltages used for a top estimation process, according to a first embodiment.

FIG. 14 illustrates, for each segment, data values obtained through five shift read operations (SFT1 to SFT5) and sensing results in the E read operation and the K read operation in the upper estimation process. With reference to FIG. 14, a description will be made of a method of acquiring separated data in the upper estimation process.

The sensing result ER in the E read operation related to a memory cell being "1 (the memory cell is in an ON state)" indicates that a threshold voltage of the memory cell is in segments (segments (49) to (54)) near a boundary between the A state and the B state. In the segments (49) to (54), it is determined whether or not read data obtained through the shift read operation is "1" on the basis of only the sensing result BR in the B read operation. When the sensing result BR from the B read operation is "1 (a memory cell is in an ON state)", read data is treated as "1". When the sensing result BR from the B read operation is "0 (a memory cell is in an OFF state)", read data is treated as "0".

Therefore, in an example, read data obtained through the respective shift read operations (SFT1 to SFT5) is subjected to an AND calculation with the sensing result ER, and thus the sensing result BR can be acquired as separated data from the read data obtained through SFT1 to SFT5.

The sensing result ER in the E read operation related to a memory cell being "0 (the memory cell is in an OFF state)" and the sensing result KR in the K read operation related to the memory cell being "1 (the memory cell is in an ON state)" indicate that a threshold voltage of the memory cell is in segments (segments (55) to (60)) near a boundary between the G state and the H state. In the segments (55) to (60), it is determined whether or not read data obtained through the shift read operation is "1" on the basis of only the sensing result HR in the H read operation. When the sensing result HR from the H read operation is "1 (a memory cell is in an ON state)", read data is treated as "0". When the sensing result HR from the H read operation is "0 (a memory cell is in an OFF state)", read data is treated as "1".

Therefore, in an example, read data obtained through the respective shift read operations (SFT1 to SFT5) is subjected to an AND calculation with a result of an XOR calculation (ER XOR KR) between the sensing result ER and the sensing result KR, and then the result of the AND calculation is inverted, so that the sensing result HR can be acquired as separated data from the read data obtained through SFT1 to SFT5.

The sensing result KR for the K read operation related to a memory cell being "0 (the memory cell is in an OFF state)" indicates that a threshold voltage of the memory cell is in segments (segments (61) to (66)) near a boundary between the M state and the N state. In the segments (61) to (66), it is determined whether or not read data obtained through the shift read operation is "1" on the basis of only the sensing result NR for the N read operation. When the sensing result NR is "1 (a memory cell is in an ON state)", read data is treated as "1". When the sensing result NR is "0 (a memory cell is in an OFF state)", read data is treated as "0".

Therefore, in an example, read data obtained through the respective shift read operations (SFT1 to SFT5) is subjected to an AND calculation with an inversion of the sensing result KR, and thus the sensing result NR can be acquired as separated data from the read data obtained through SFT1 to SFT5.

Also in the upper estimation process, according to the same procedure as in the lower estimation process, the number of "1s (indicating memory cells in an ON state)" included in each piece of the separated data BR, HR, and NR is counted, and histograms related to the respective read voltages VB, VH, and VN can be generated on the basis of counting results. Optimal read voltages VB', VH', and VN' are separately estimated on the basis of the histograms related to the read voltages VB, VH, and VN.

Next, a description will be made of a process of estimating each read voltage used in a read operation on a top page. A process of estimating each read voltage used in a read operation on a top page will be referred to as a top estimation process.

In the top estimation process, in the same manner as in the lower estimation process, the middle estimation process, or the upper estimation process, a plurality of shift read operations are executed by changing (shifting) the respective read voltages. Each shift read operation included in the top estimation process is the same as a normal read operation performed on a top page, and is, specifically, a process of determining data of a top bit by executing the E read operation, the J read operation, the L read operation, and the O read operation. However, the read voltages VE, VJ, VL, and VO are shifted in each of a plurality of shift read operations.

FIG. 15 illustrates various read voltage VCGR used in the top estimation process. In the example illustrated in FIG. 15, five shift read operations are executed. Each of the five shift read operations is indicated by SFTx (where x is an integer of 1 to 5). In the shift read operation SFTx, Shift_ex is used as the read voltage VE, Shift_jx is used as the read voltage VJ, Shift_lx is used as the read voltage VL, and Shift_ox is used as the read voltage VO.

In the top estimation process, for example, the H read operation, the K read operation, and the M read operation are executed as mask data read operations. In other words, a sensing result HR from the H read operation, a sensing result KR from the K read operation, and a sensing result MR from the M read operation are used as mask data.

In the top estimation process, the range in which a threshold voltage of each memory cell can be present is divided into a total of 24 segments (labeled (67) to (90)) in FIG. 15) by the respective read voltages used in the five shift read operation, the read voltage VH used in the H read operation, the read voltage VK used in the K read operation, and the read voltage VM used in the M read operation.

FIG. 16 illustrates, for each segment, data values obtained through five shift read operations (SFT1 to SFT5) and sensing results in the H read operation, the K read operation, and the M read operation in the top estimation process. With reference to FIG. 16, a description will be made of a method of acquiring separated data in the top estimation process.

The sensing result HR in the H read operation related to a memory cell being "1 (the memory cell is in an ON state)" indicates that a threshold voltage of the memory cell is in segments (segments (67) to (72)) near a boundary between the D state and the E state. In the segments (67) to (72), it is determined whether or not read data obtained through the shift read operation is "1" on the basis of only the sensing result ER in the E read operation. When the sensing result ER in the E read operation is "1 (a memory cell is in an ON state)", read data is treated as "1". When the sensing result ER in the E read operation is "0 (a memory cell is in an OFF state)", read data is treated as "0".

Therefore, read data obtained through the respective shift read operations (SFT1 to SFT5) is subjected to an AND calculation with the sensing result HR, and thus the sensing result ER can be acquired as separated data from the read data obtained through SFT1 to SFT5.

The sensing result HR in the H read operation related to a memory cell being "0 (the memory cell is in an OFF state)" and the sensing result KR in the K read operation related to the memory cell being "1 (the memory cell is in an ON state)" indicate that a threshold voltage of the memory cell is in segments (segments (73) to (78)) near a boundary between the I state and the J state. In the segments (73) to (78), it is determined whether or not read data obtained through the shift read operation is "1" on the basis of only the sensing result JR in the J read operation. When the sensing result JR in the J read operation is "1 (a memory cell is in an ON state)", read data is treated as "0". When the sensing result JR in the J read operation is "0 (a memory cell is in an OFF state)", read data is treated as "1".

Therefore, read data obtained through the respective shift read operations (SFT1 to SFT5) is subjected to an AND calculation with the result of an XOR calculation (HR XOR KR) between the sensing result HR and the sensing result KR, and the result of the AND calculation is inverted, so that the sensing result JR for the J read operation can be acquired as separated data from the read data obtained through SFT1 to SFT5.

The sensing result KR in the K read operation related to a memory cell being "0 (the memory cell is in an OFF state)" and the sensing result MR in the M read operation related to the memory cell being "1 (the memory cell is in an ON state)" indicate that a threshold voltage of the memory cell is in segments (segments (79) to (84)) near a boundary between the K state and the L state. In the segments (79) to (84), it is determined whether or not read data obtained through the shift read operation is "1" on the basis of only the sensing result LR in the L read operation. When the sensing result LR in the L read operation is "1 (a memory cell is in an ON state)", read data is treated as "1". When the sensing result LR in the L read operation is "0 (a memory cell is in an OFF state)", read data is treated as "0".

Therefore, read data obtained through the respective shift read operations (SFT1 to SFT5) is subjected to an AND calculation with a result of an XOR calculation (KR XOR MR) between the sensing result KR and the sensing result MR, and thus the sensing result LR for the L read operation can be acquired as separated data from the read data obtained through SFT1 to SFT5.

The sensing result MR in the M read operation related to a memory cell being "0 (the memory cell is in an OFF state)" indicates that a threshold voltage of the memory cell is in segments (segments (85) to (90)) near a boundary between the N state and the O state. In the segments (85) to (90), it is determined whether or not read data obtained through the shift read operation is "1" on the basis of only the sensing result OR from the O read operation. When the sensing result OR in the O read operation is "1 (a memory cell is in an ON state)", read data is treated as "0". When the sensing result OR in the O read operation is "0 (a memory cell is in an OFF state)", read data is treated as "1".

Therefore, read data obtained through the respective shift read operations (SFT1 to SFT5) is subjected to an AND calculation with an inversion of the sensing result MR from the M read operation, and then the AND calculation result is inverted, thus the sensing result OR can be acquired as separated data from the read data obtained through SFT1 to SFT5.

Also in the top estimation process, according to the same procedure as in the lower estimation process, the number of "1s (indicating memory cells in an ON state)" included in each piece of the separated data ER, JR, LR, OR is counted, and histograms related to the respective read voltages VE, VJ, VL, and VO are generated on the basis of counting results. Optimal read voltages VE', VJ', VL', and VO' are separately estimated on the basis of the histograms related to the read voltages VE, VJ, VL, and VO.

The memory controller 20 causes the memory chip 10 to execute a read operation using an estimated value of an optimal read voltage obtained in the above-described way as the read voltage VCGR, and can thus reduce the number of errors included in read data.

As mentioned above, in the estimation process, a plurality of shift read operations are executed to generate histograms. In the above example, five shift read operations are executed to generate a histogram having four bins. The number of necessary shift read operations increases according to the number of necessary bins of a histogram. However, the time required for the estimation process increases according to the number of necessary shift read operations.

In the first embodiment, in the estimation process, the multi-plane read operation in which the plane P0 and the plane P1 execute shift read operations in parallel is executed. Consequently, the time required to execute the number of necessary shift read operations is reduced. Hereinafter, the multi-plane read operation will be abbreviated to an MPR.

Figure 17:
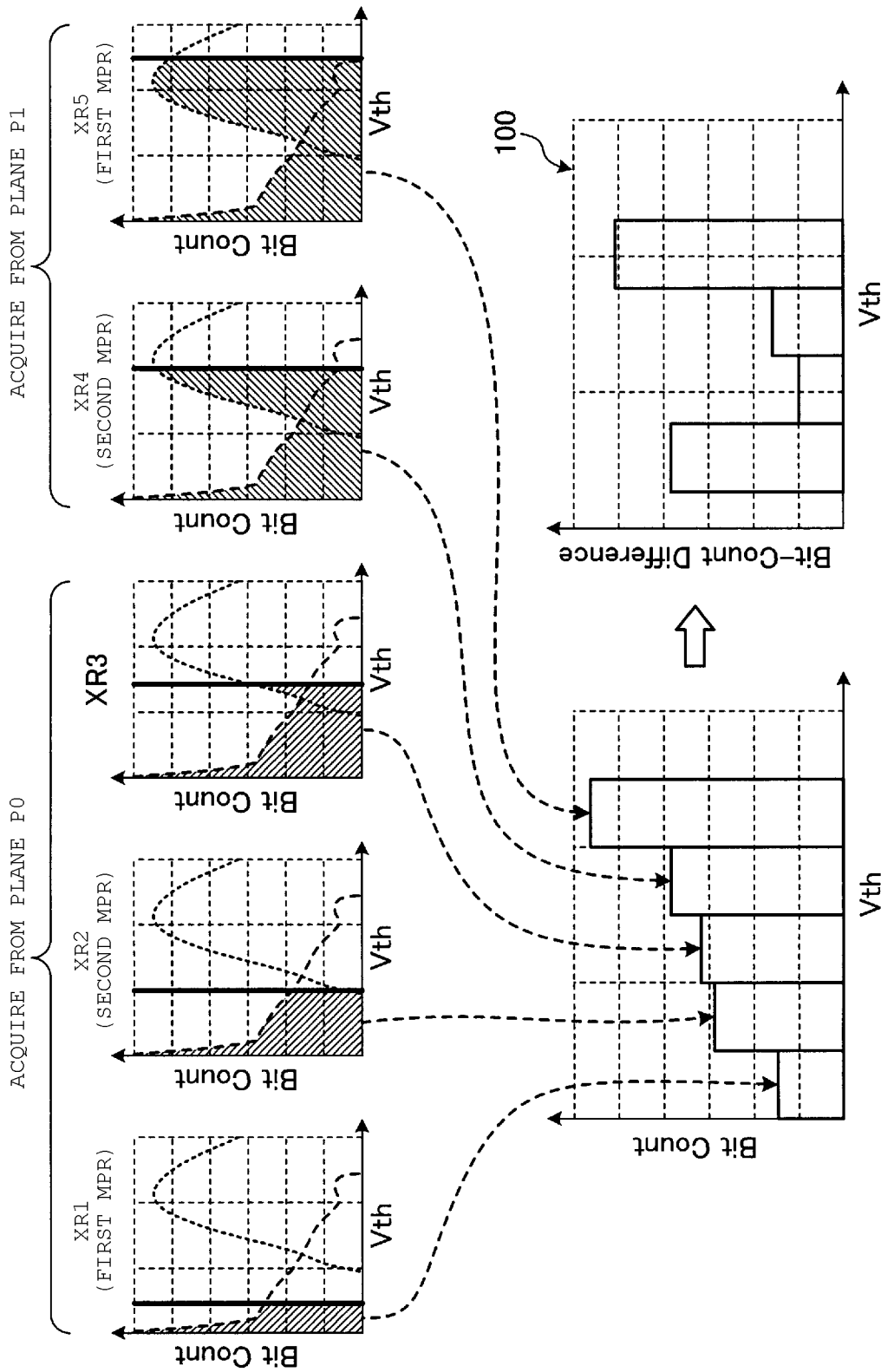
FIG. 17 is a schematic diagram illustrating a feature of an estimation process according to a first embodiment.

FIG. 17 is a schematic diagram illustrating one of features of the estimation process of the first embodiment. As illustrated in FIG. 17, SFT1, SFT2, and SFT3 are executed in the plane P0, and SFT4 and SFT5 are executed in the plane P1. SFT1 and SFT5 are executed in parallel according to the first multi-plane read operation. SFT2 and SFT4 are executed in parallel according to the second multi-plane read operation.

Consequently, the separated data XR obtained through five shift read operations such as SFT1 to SFT5 is acquired through two multi-plane read operations and one single-plane read operation. In the multi-plane read operation, the shift read operations are executed in parallel in the planes P0 and P1. Therefore, the time required for five shift read operations such as SFT1 to SFT5 is reduced compared with a case where all of the five shift read operations such as SFT1 to SFT5 are executed by using a single-plane read operation.

The separated data XR is acquired in each of five shift read operations using a multi-plane read operation. The number of the data "1" included in the separated data XR is counted, and thus the number of memory cells turned on when a read voltage is applied thereto is counted. A histogram 100 is created on the basis of a result of counting the number of memory cells turned on when a read voltage is applied thereto.

An offset may occur between a distribution of a threshold voltage of a memory cell in the plane P0 and a distribution of a threshold voltage of a memory cell in the plane P1. When the offset occurs, the memory controller 20 may add or subtract an amount corresponding to the offset to or from a result of counting the number of the data "1" related to one of the plane P0 and the plane P1, so as to compensate for the offset.

Next, a description will be made of various command sequences used in the estimation process.

Figure 18:
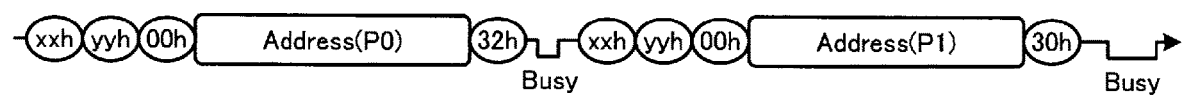
FIG. 18 is a diagram illustrating a command sequence for realizing a single-state read operation on a plurality of planes through a multi-plane read operation.

FIG. 18 is a diagram illustrating an example of a command sequence for realizing a single-state read operation on a plurality of planes through a multi-plane read operation (MPR). This command sequence will be referred to as a single-state read (MPR) command sequence.

As illustrated in FIG. 18, the single-state read (MPR) command sequence includes two subsets each formed of xxh, yyh, 00h, address information, and 32h (or 30h). A single-state read operation is instructed to be performed on two planes due to the two subsets.

xxh initially sent in each subset is a prefix command indicating a single-state read operation. yyh following xxh is a command for designating a read voltage used in the single-state read operation. 00h following yyh is a command for performing a notification of transmission of address information indicating a read target. The address following 00h is address information indicating the read target.

32h sent last in the first subset is a command for giving an instruction for parallel operations on a plurality of planes, and indicates that the commands and the address information transmitted hitherto correspond to a single plane. When 32h is received, the memory chip 10 enters a busy state from a ready state, and then successively enters a ready state from a busy state. This operation indicates that the memory chip 10 can consecutively receive commands from the memory controller 20.

30h sent last in the second subset gives an instruction for starting an operation. When 30h is received, the memory chip 10 simultaneously starts a single-state read operation on the plane P0 for which an instruction is given by the first subset and a single-state read operation on the plane P1 for which an instruction is given by the second subset. The memory chip 10 is maintained in a busy state until the single-state read operation on the plane P0 and the single-state read operation on the plane P1 are finished.

Figure 19:
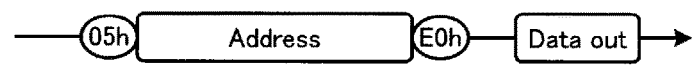
FIG. 19 is a diagram illustrating a command sequence for acquiring data from a memory chip.

FIG. 19 is a diagram illustrating an example of a command sequence for acquiring data from the memory chip 10. This command sequence will be referred to as a data output command sequence.

05h initially sent in the data output command sequence is a prefix command indicating data output. An address following 05h is address information indicating a leading position of an output target portion of read data stored in the data latch XDLC. E0h is a command for giving an instruction for data output. After E0h is transmitted to the memory chip 10, the memory controller 20 may acquire a part or the whole of the read data stored in the data latch XDLC by toggling the read enable signal /RE (Data out).

When a plurality of portions of read data that are read from different planes are acquired, the memory controller 20 executes the data output command sequence for each plane.

Figure 20:
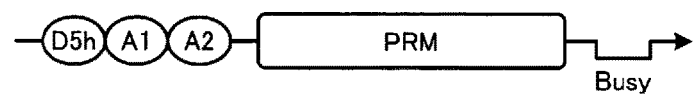
FIG. 20 is a diagram illustrating a command sequence for setting a shift amount.

The shift read operation is executed after a shift amount is set. FIG. 20 is a diagram illustrating an example of a command sequence for setting a shift amount. This command sequence is a command sequence for setting a value for the parameter register 33, and setting a value for the parameter register 33 will be referred to as a set feature. The shift amount is one of parameters, and is set for the parameter register 33. Therefore, setting of the shift amount is a kind of set feature. The command sequence in FIG. 20 will be referred to as a set feature command sequence.

D5h initially transmitted in the set feature command sequence is a prefix command indicating the set feature. A1 following D5h is a LUN address. A2 following A1 is address information of the parameter register 33 used for the set feature. It is necessary to designate a specific register address in accordance with a parameter of which setting is changed. When the shift amount is set, an address in which the shift amount is stored is sent as A2. Of the parameter register 33A for the plane P0 and the parameter register 33B for the plane P1, a storage destination may be designated by A2. PRM following A2 is a value set as a parameter. When the shift amount is set, the shift amount is sent as the parameter PRM following A2. When the command sequence is received, the memory chip 10 stores PRM following A2 into the parameter register 33. The memory chip 10 is maintained in a busy state until storage of data into the parameter register 33 is finished.

In a read operation after the shift amount is set, the set shift amount is used regardless of whether or not the read operation is a multi-plane read operation. In other words, a shift read operation is realized by executing a normal read operation after the shift amount has been set.

Figure 21:
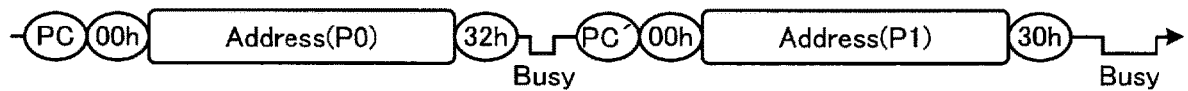
FIG. 21 is a diagram illustrating a command sequence for realizing a read operation on a plurality of planes through a multi-plane read operation.

FIG. 21 is a diagram illustrating an example of a command sequence for realizing a read operation on a plurality of planes through a multi-plane read operation. The command sequence illustrated in FIG. 21 is used to execute a normal read operation through a multi-plane read operation, but, in the first embodiment, the command sequence is used in a shift read operation. Therefore, the command sequence illustrated in FIG. 21 will be referred to as a shift read (MPR) command sequence.

As illustrated in FIG. 21, the shift read (MPR) command sequence includes two subsets each formed of PC (or PC'), ooh, address information, and 32h (or 30h). A read operation is instructed to be performed on two planes due to the two subsets.

PC (or PC') initially sent in each subset is a command for selecting one of a top page, an upper page, a middle page, and a lower page, and gives an instruction for reading from the selected page. Herein, a lower page is a target, and thus a value indicating the lower page is transmitted as PC and PC'. 00h following PC (or PC') is a command for performing a notification of transmission of address information indicating a read target. The address following 00h is address information indicating the read target.

32h sent last in the first subset is a command for giving an instruction for a multi-plane operation, and indicates that the commands and the address information transmitted thereafter correspond to a single plane. When 32h is received, the memory chip 10 enters a busy state from a ready state, and then successively enters a ready state from a busy state. This operation indicates that the memory chip 10 can consecutively receive commands from the memory controller 20.

30h sent last in the second subset gives an instruction for starting an operation. When 30h is received, the memory chip 10 simultaneously starts a read operation on the plane P0 for which an instruction is given by the first subset and a read operation on the plane P1 for which an instruction is given by the second subset. The memory chip 10 is maintained in a busy state until the read operation on the plane P0 and the read operation on the plane P1 are finished.

Read data stored in the data latch XDLC of each plane through the multi-plane read operation is acquired from the memory chip 10 by the memory controller 20 according to the data output command sequence. The data output command sequence is transmitted to each plane.

Next, with reference to FIGS. 22 to 26, a description will be made of an operation of the memory system 1 related to the first embodiment. Herein, as an example, a description will be made of a process of reading data from a certain lower page of the plane P0. The plane P0 is replaced with the plane P1, and the plane P1 is replaced with the plane P0, and thus the operations illustrated in FIGS. 22 to 26 can be understood as a process of reading data from the plane P1. When a read target page is a page other than the lower page, operations similar to the operations illustrated in FIGS. 22 to 26 are executed excepting that the necessary mask data and/or a read voltage for a boundary read operation differs.

A word line to which the read target lower page belongs will be referred to as a target word line. A block to which the target word line belongs will be referred to as a target block.

Figure 22:
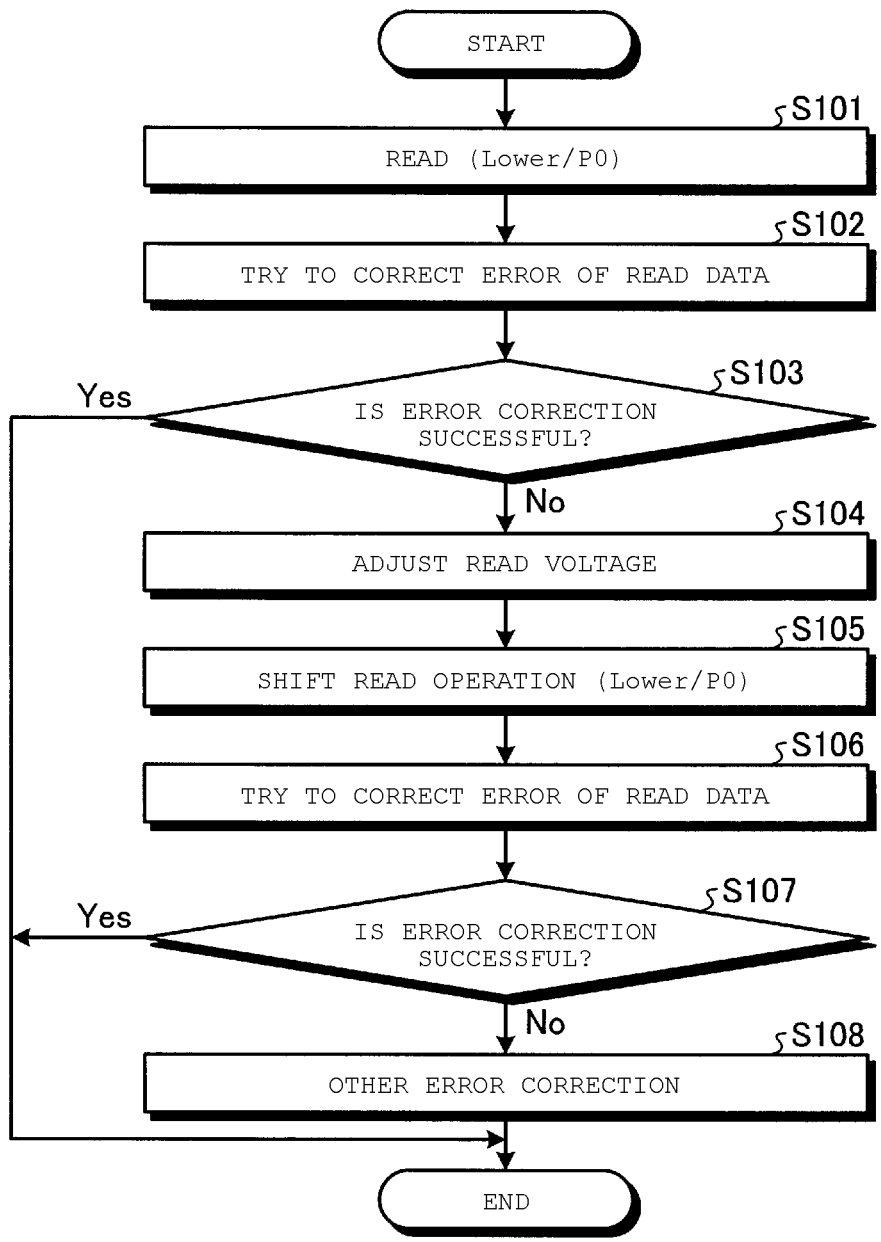
FIG. 22 is a flowchart schematically illustrating an operation of a memory system according to a first embodiment.

FIG. 22 is a flowchart schematically illustrating an example of an operation of the memory system 1 related to the first embodiment. First, the memory controller 20 causes the memory chip 10 to read data from the read target lower page in the plane P0 (S101). The read data that is read from the target word line is sent to the memory controller 20 via the data latch XDLC.

When the read data is received, the memory controller 20 controls the ECC circuit 23 to attempt to perform error correction on the read data (S102). The memory controller 20 determines whether the error correction has been successful (S103). The error correction being successful indicates that an error is not included in the read data, or an error included in the read data can be corrected such that the read data not including the error can be obtained.

If the error correction is successful (Yes in S103), the operation is finished. If the error correction fails (No in S103), the memory controller 20 executes adjustment of a read voltage (S104). Details of the process in S104 will be described later.

After S104, the memory controller 20 causes the memory chip 10 to execute a shift read operation using the adjusted read voltage (S105). In other words, reading of the lower page stored in the target word line is retried by using the adjusted read voltage. The read data is sent to the memory controller 20 via the data latch XDLC.

When the read data is received, the memory controller 20 tries error correction on the read data in the same manner as in S102 (S106). The memory controller 20 determines whether or not the error correction has been successful (S107). When the error correction is successful (Yes in S107), the operation is finished. When the error correction fails (No in S107), the memory controller 20 executes error correction according to any other method (S108), and then operation is finished.

Figure 23:
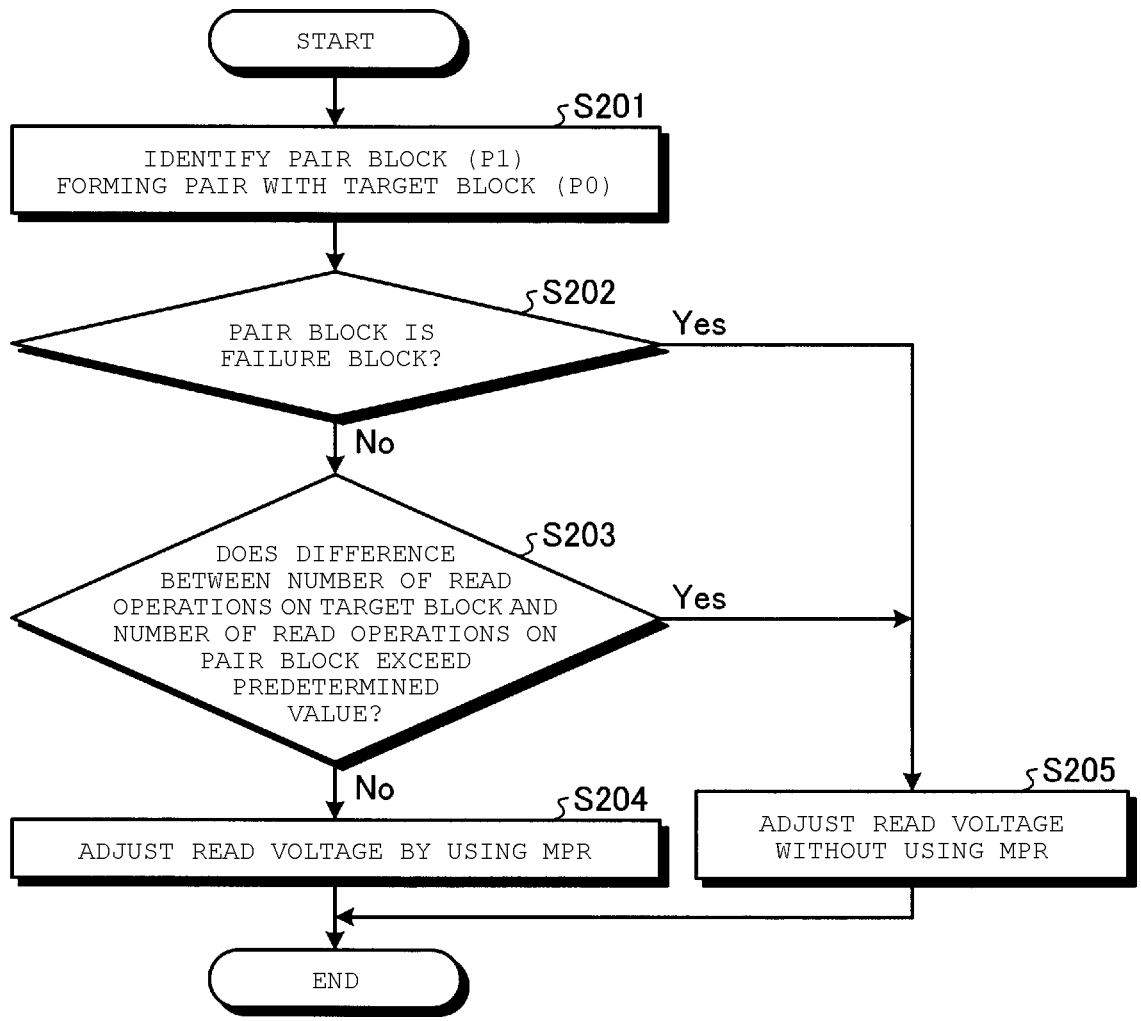
FIG. 23 is a flowchart illustrating an operation of adjusting a read voltage according to a first embodiment.

FIG. 23 is a flowchart illustrating an example of an operation of adjusting a read voltage, that is, the process in S104 in FIG. 22 according to the first embodiment.

First, the memory controller 20 identifies a block of the plane P1 that is a pair with the target block of the plane P0 (S201).

For example, a plurality of (physical) blocks in the different planes may be collectively managed as a single logical block. The memory controller 20 may simultaneously execute various operations on the plurality of blocks forming the single logical block. In other words, for example, a write operation or an erase operation may be executed in the logical block unit incorporating physical blocks in different planes.

Figure 24:
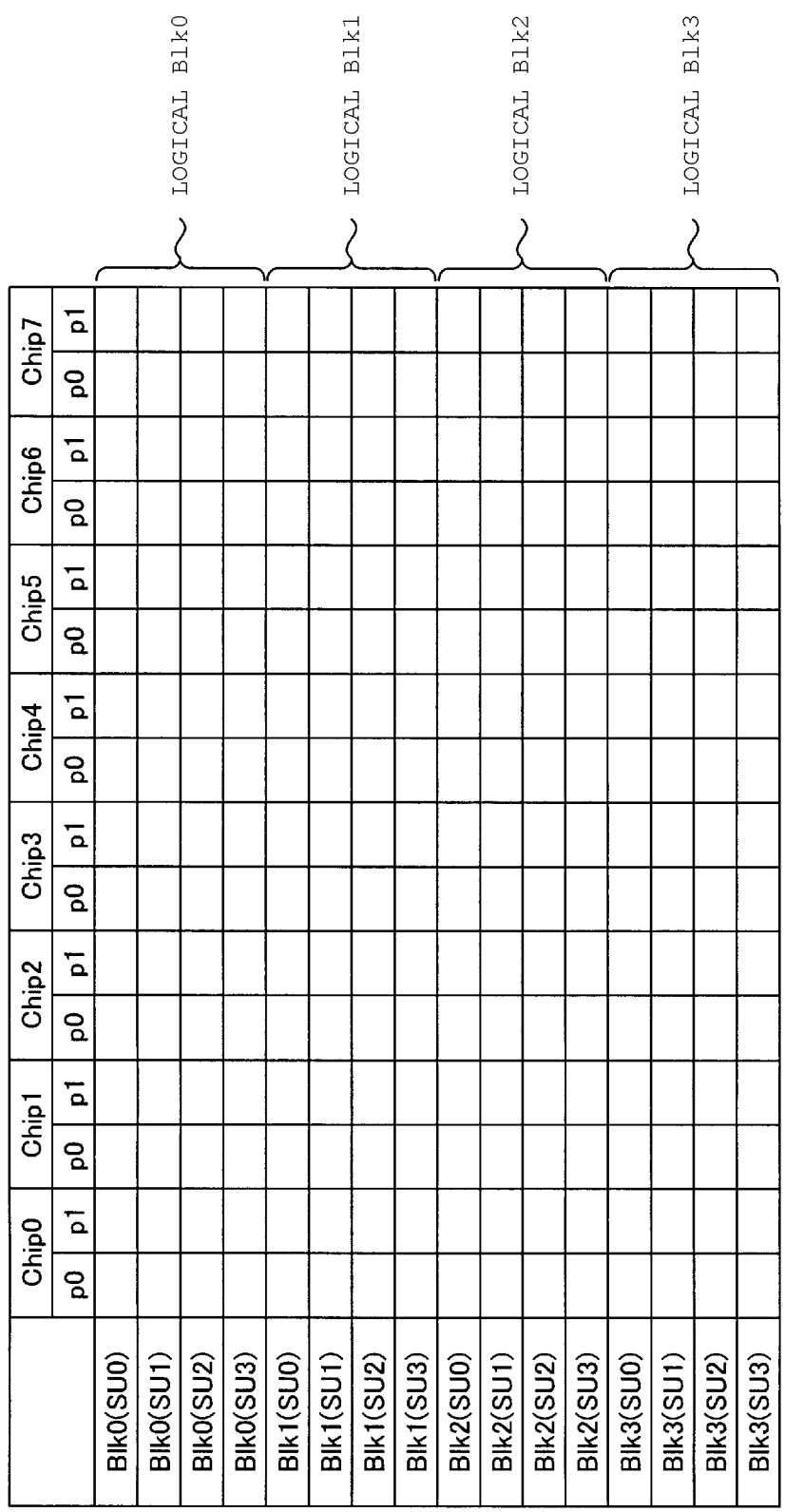
FIG. 24 is a schematic diagram illustrating a configuration of a logical block according to a first embodiment.

FIG. 24 is a schematic diagram illustrating an example of a configuration of logical blocks. In the example illustrated in FIG. 24, eight memory chips 10 (such as Chip0 to Chip7) are provided in the memory system 1. Blocks with the same ID are selected from two planes (p0/p1) of each memory chip 10, and a set of these blocks forms a single logical block. In the example illustrated in FIG. 24, block IDs of blocks forming a single logical block are the same as each other, but in other examples block IDs of blocks forming a single logical block need not be the same as each other.

During writing on a single logical block, writing is executed on a set of pages respectively selected from the blocks forming the logical block. Pages identified with the same page ID are respectively selected from the plurality of blocks. In each memory chip 10, writing is executed in parallel on blocks in the logical block in a plurality of respective planes. In other words, data is written through a multi-plane operation with respect to the plurality of planes.

A plurality of logical blocks is generated, for example, by a firmware program or the like. Information regarding of the particular blocks forming each of the plurality of logical blocks is recorded as management information (e.g., a logical-to-physical table), and is stored in a predetermined memory (for example, the RAM 22 or the memory chip 10, or both thereof).

The block with the plane P1 forming a pair with the target block with the plane P0 is a member block of the same logical block as the target block. In S201, the memory controller 20 refers to the management information to identify the block forming a pair with the target block. The block with the plane P1 forming the pair with the target block with the plane P0 will be referred to as a pair block.

With reference again, to FIG. 23, after S201, the memory controller 20 determines whether or not the identified pair block is a failure block (S202). A failure block (also called a failed block) is a block for which further use has been determined as being impossible due to a failure or the like in a circuit of the block. A failure block caused by the use thereof is recorded in failure block information (e.g., a table), and this is stored in a predetermined location in memory (for example, in the RAM 22 or in the memory chip 10, or both thereof). The memory controller 20 determines whether or not the pair block is a failure block by referring to the failure block information.

When the identified pair block is not a failure block (No in S202), the memory controller 20 determines whether there is a difference between the number of read operations previously performed on the target block and the number of read operations previously performed on the pair block exceeds a predetermined value (S203).

As described above, for example, a write operation or an erase operation may be executed in the logical block unit. Therefore, as long as a read operation is also performed in a logical block unit, the degree of use (or associated stress or wear) received by each physical block in a single logical block will be identical. As a result, changes in distributions of threshold voltages of memory cells in each of the plurality of blocks will tend to be similar to each other.

However, when read operations are performed in a single logical block according to completely different patterns (e.g., sub-logical block unit operations), changes in distributions of threshold voltages of memory cells in each of the plurality of blocks are generally not similar to each other.

In the first embodiment, when changes in threshold voltages tend to be similar to each other between the target block and the pair block, an estimation process using a multi-plane read operation can be executed. The process of S203 is an example of determining whether changes in threshold voltages of memory cells are likely to be similar to each other in the target block and the pair block.

Specifically, if a difference between the number of read operations on the target block and the number of read operations on the pair block does not exceed the predetermined value (No in S203), it may be expected that changes in threshold voltages of memory cells will tend to be similar between the target block and the pair block, and thus the memory controller 20 adjust a read voltage according to an estimation process using a multi-plane read operation (S204).

When a difference between the number of read operations on the target block and the number of read operations on the pair block exceeds the predetermined value (Yes in S203), it may expected that changes in threshold voltages will tend not to be similar to each other between the target block and the pair block, and thus the memory controller 20 adjusts a read voltage according to an estimation process that does not use a multi-plane read operation, and instead performs an estimation process using a single-plane read operation (S205).

The operation of adjusting a read voltage is finished after the process in S204 or S205.

When the pair block is a failure block (Yes in S202), the memory controller 20 executes the process in S205.

Figure 25:
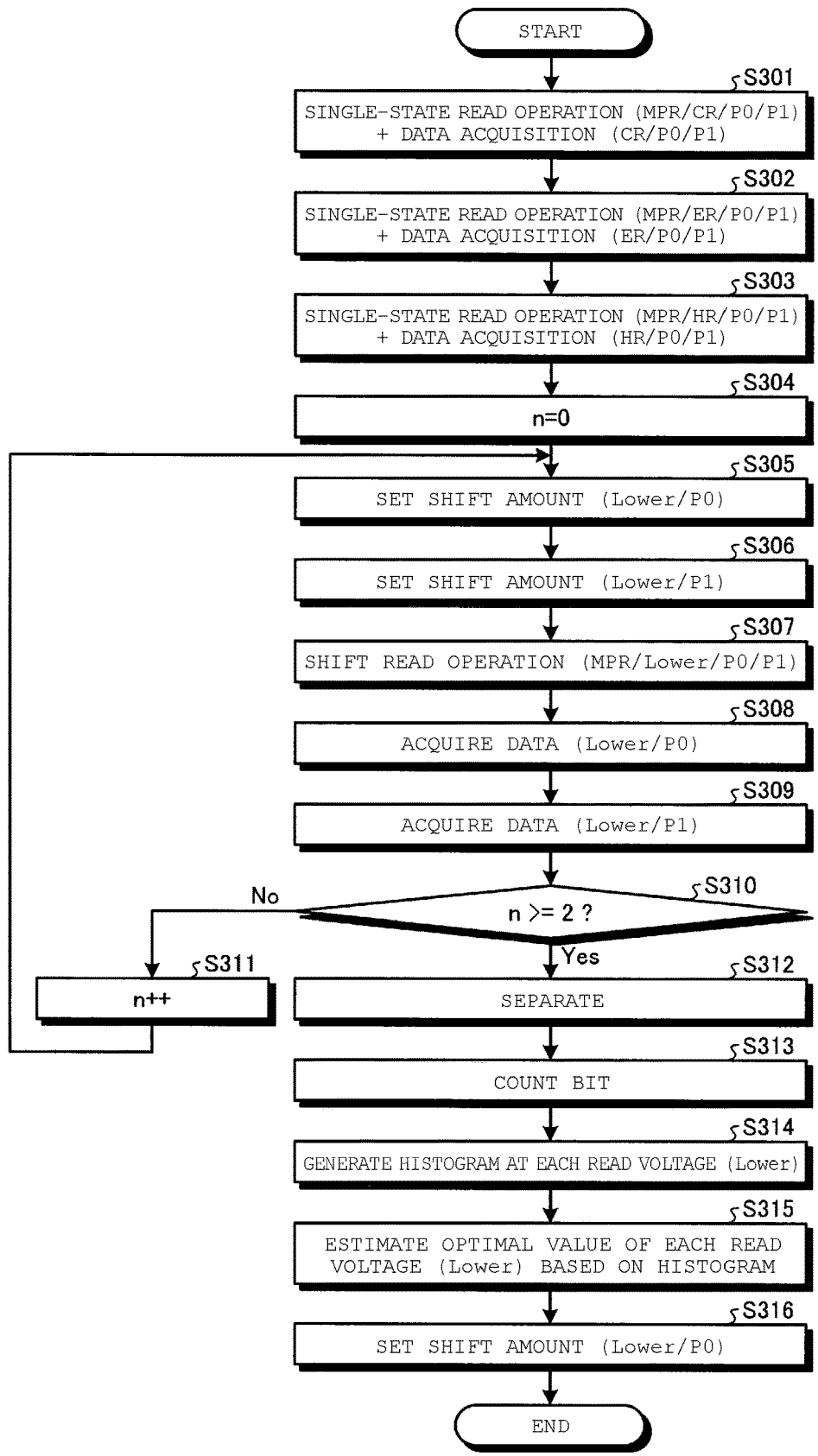
FIG. 25 is a flowchart illustrating a process of adjusting a read voltage by using a multi-plane read operation.

FIG. 25 is a flowchart illustrating an example of a process related to the first embodiment of adjusting a read voltage by using a multi-plane read operation. The process illustrated in FIG. 25 is executed in S204.

First, in S301 to S303, so called "mask data" is acquired. When a lower page is a read target, the read data CR, the read data ER, and the read data HR are acquired as mask data. A single-state read operation for acquiring each piece of mask data can be executed according to a multi-plane read operation.

Specifically, first, in S301, the memory controller 20 instructs the memory chip 10 to execute a multi-plane read operation of executing a single-state read operation for acquiring the read data CR from each of the plane P0 (more specifically, the target word line in the target block) and the plane P1 (more specifically, a word line in the pair block that is written at the same time as that of the target word line). The read data CR read from each of the plane P0 and the plane P1 is thus acquired.

In S301, the memory controller 20 designates the target word line in the plane P0 on the basis of the address included in the first subset of the single-state read (MPR) command sequence. A word line in the plane P1 forming a pair with the target word line is designated on the basis of the address included in the second subset.

The memory controller 20 transmits the single-state read (MPR) command sequence, and then transmits the data output command sequence for each plane. The memory controller 20 stores the read data CR acquired from the memory chip 10, into, for example, the RAM 22.

In S302, the memory controller 20 transmits the single-state read (MPR) command sequence to the memory chip 10, and thus causes the memory chip 10 to read the read data ER from each of the plane P0 and the plane P1. The memory controller 20 transmits the data output command sequence to the memory chip 10 for each plane, and thus acquires the read data ER read from each of the plane P0 and the plane P1. The memory controller 20 stores the read data ER acquired from the memory chip 10, into, for example, the RAM 22.

In S303, the memory controller 20 transmits the single-state read (MPR) command sequence to the memory chip 10, and thus causes the memory chip 10 to read the read data HR from each of the plane P0 and the plane P1. The memory controller 20 transmits the data output command sequence to the memory chip 10 for each plane, and thus acquires the read data HR read from each of the plane P0 and the plane P1. The memory controller 20 stores the read data HR acquired from the memory chip 10, into, for example, the RAM 22.

Next, a loop process from. S305 to S309 is executed three times. In each loop process, shift read operations on the plane P0 and the plane P1 are executed in parallel according to a multi-plane read operation.

In other words, in the example illustrated in FIG. 25, six shift read operations (such as SFT1 to SFT6) are executed. In an example, three shift read operations (such as SFT1 to SFT3) are executed on the plane P0, and three shift read operations (such as SFT4 to SFT6) are executed on the plane P1. More specifically, for example, in the first loop process, the shift read operation SFT1 on the plane P0 and the shift read operation SFT6 on the plane P1 are executed according to a multi-plane read operation. In the second loop process, the shift read operation SFT2 on the plane P0 and the shift read operation SFT5 on the plane P1 are executed according to a multi-plane read operation. In the third loop process, the shift read operation SFT3 on the plane P0 and the shift read operation SFT4 on the plane P1 are executed according to a multi-plane read operation. Consequently, the six shift read operations such as SFT1 to SFT6 are executed.

The number of multi-plane read operations to be executed may be changed according to the number of bins of the histogram 100. For example, when the number of bins of the histogram 100 is indicated by a, (a+1) shift read operations are necessary. When (a+1) is an even number, multi-plane read operations can be executed for a number of times obtained by dividing (a+1) by 2, and thus (a+1) shift read operations are realized by number of multi-plane read operations equal to one-half (a+1). When (a+1) is an odd number, then (a+1) shift read operations can be realized by execution of multi-plane read operations for number of times equal to the quotient obtained by dividing (a+1) by 2 and then a single-plane read operation executed once.

Before starting the loop process, the memory controller 20 first resets a variable n that is used as a counter of the loop process to zero (S304). The memory controller 20 separately sets shift amounts for the plane P0 and the plane P1 (S305 and S306). The memory controller 20 transmits the set feature command sequence for each plane, and thus sets the shift amount respectively for each plane. The memory controller 20 sets a shift amount used in a shift read operation selected from among SFT1 to SFT3. In S306, the memory controller 20 sets a shift amount used in a shift read operation selected from among SFT4 to SFT6.

When setting of the shift amount for each plane is completed, the memory controller 20 causes the memory chip 10 to execute a multi-plane read operation executing shift read operations on both the plane P0 and the plane P1 (S307). In S307, the memory controller 20 transmits the shift read (MPR) command sequence to the memory chip 10.

When the process in S307 is completed, the memory controller 20 transmits the data output command sequence to the memory chip 10 for each plane, and thus acquires read data obtained through the shift read operation on the plane P0 and read data obtained through the shift read operation on the plane P1 (S308 and S309). The memory controller 20 stores the read data acquired from each plane in the RAM 22, for example.

Next, the memory controller 20 determines whether or not n exceeds 2 (S310). This process corresponds to a process of determining whether or not three loop processes have been completed. When n does not exceed two (No in S310), the memory controller 20 increments n by 1 (S311), and executes the processes from S305 to S309 again.

When n exceeds two (Yes in S310), that is, three loop processes have been completed, the memory controller 20 separates read data obtained through the six shift read operations SFT1 to SFT6 corresponding to the three multi-plane read operations as the separated data XR (S312).

Here, since the lower page is a processing target, in S312, read data obtained through the respective shift read operations is separated as separated data AR, DR, FR, and KR. In the process in S312, the separated data AR, DR, FR, and KR are acquired by using the read data CR, ER, and HR (obtained in S301 to S303) as mask data.

Next, the memory controller 20 counts the number of "1s" indicating memory cells in an ON state with respect to each piece of the separated data AR, DR, FR, and KR (S313). The memory controller 20 generates the histogram 100 related to each of the read voltages VA, VD, VF, and VK on the basis of a result of counting the number of "1s" indicating memory cells in an ON state (S314).

The memory controller 20 estimates optimal values VA', VD', VF', and VK' of the read voltages VA, VD, VF, and VK on the basis of the histogram 100 related to each of the read voltages VA, VD, VF, and VK (S315).

Next, the memory controller 20 sets a shift amount such that estimated values of the optimal values VA', VD', VF', and VK' are used as the read voltages VA, VD, VF, and VK during a read operation on the plane P0 (S316). In S316, the shift amount is set by using a set feature command. Consequently, shift read operations using the adjusted read voltages are executable on a target page.

The process of adjusting a read voltage by using a multi-plane read operation is finished after the shift amount is set (S316).

Figure 26:
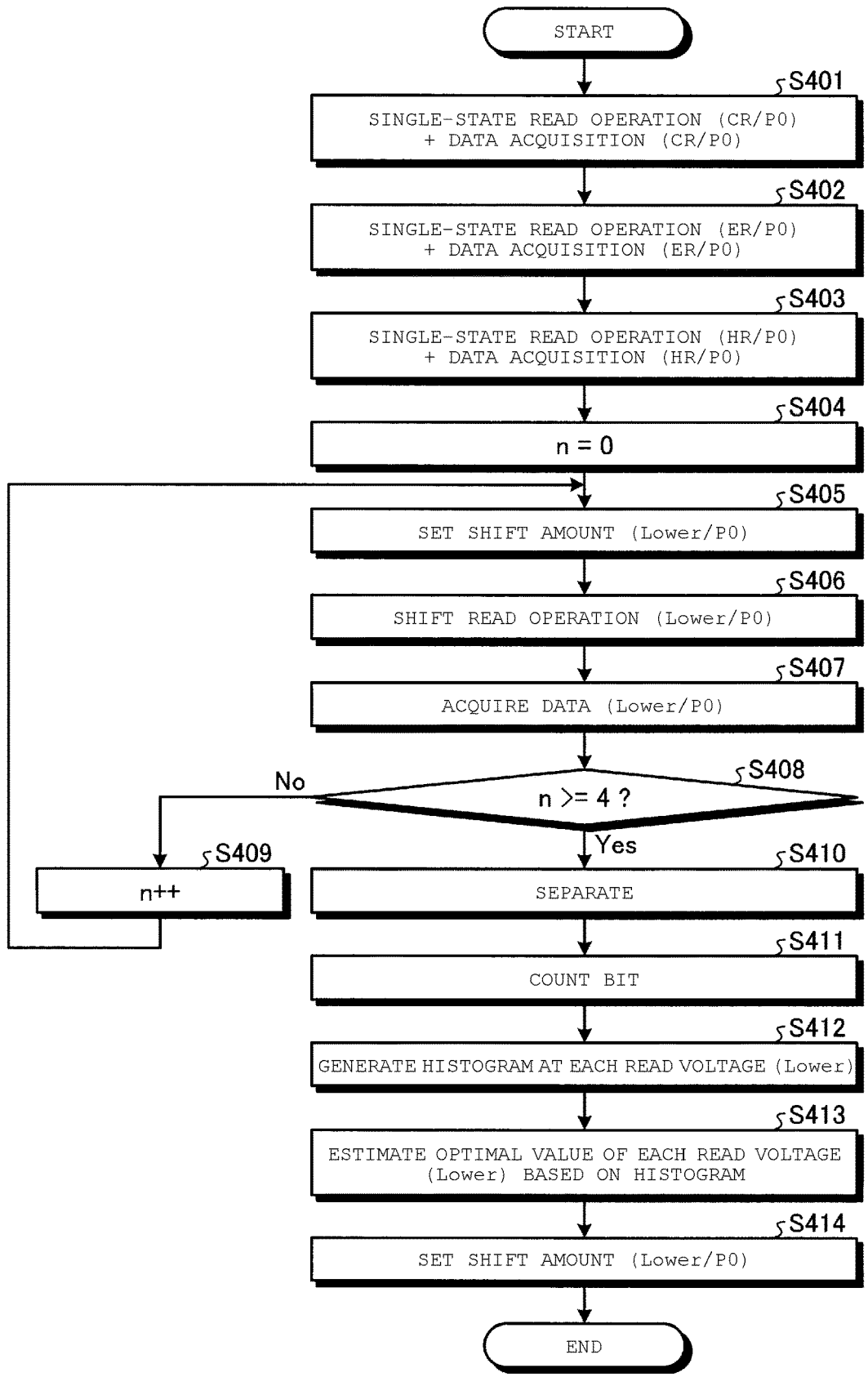
FIG. 26 is a flowchart illustrating a process of adjusting a read voltage by using a single-plane read operation.

FIG. 26 is a flowchart illustrating an example of a process according to the first embodiment of adjusting a read voltage by using a single-plane read operation. The process illustrated in FIG. 26 is executed in S205.

First, in S401 to S403, mask data is acquired. When the lower page is to be read, the read data CR, the read data ER, and the read data HR are used as mask data. A single-state read operation for acquiring each piece of mask data is executed according to a single-plane read operation.

Specifically, first, in S401, the memory controller 20 instructs the memory chip 10 to execute a single-plane read operation of executing a single-state read operation for acquiring the read data CR from the plane P0 (specifically, the target word line). The read data CR read from the plane P0 is acquired.

In S402, the memory controller 20 instructs the memory chip 10 to execute a single-plane read operation of executing a single-state read operation for acquiring the read data ER from the plane P0 (specifically, the target word line). The read data ER read from the plane P0 is acquired.

In S403, the memory controller 20 instructs the memory chip 10 to execute a single-plane read operation of executing a single-state read operation for acquiring the read data HR from the plane P0 (specifically, the target word line). The read data HR read from the plane P0 is acquired.

Next, a loop process from S405 to S407 is executed five times. In each loop process, a shift read operation on the plane P0 is executed according to a single-plane read operation.

In other words, in the example illustrated in FIG. 26, five shift read operations such as SFT1 to SFT5 are executed. The five shift read operations such as SFT1 to SFT5 are executed on the plane P0.

Also in a case of an estimation process using a single-plane read operation, in the same manner as in an estimation process using a multi-plane read operation, six shift read operations such as SFT1 to SFT6 may be executed. When the six shift read operations such as SFT1 to SFT6 are executed, the loop process from S405 to S407 is executed six times.

Before starting the loop process from S405 to S407, first, the memory controller 20 resets the value n that is a counter of the loop process to zero (S404). The memory controller 20 sets a shift amount related to the plane P0 (S405). The memory controller 20 transmits the set feature command sequence, and thus sets the shift amount related to the plane P0. The memory controller 20 sets a shift amount used in a shift read operation selected from among SFT1 to SFT5.

Next, the memory controller 20 causes the memory chip 10 to execute a shift read operation on the plane P0 (S406). In S406, the shift read operation is executed according to a single-plane read operation.

Next, the memory controller 20 transmits the data output command sequence to the memory chip 10, and thus acquires read data obtained through the shift read operation on the plane P0 (S407). The memory controller 20 stores the read data acquired from the plane P0, into, for example, the RAM 22.

Next, the memory controller 20 determines whether or not n exceeds 4 (S408). This process corresponds to a process of determining whether or not five loop processes are completed. When n does not exceed 4 (No in S408), the memory controller 20 increments n by 1 (S409), and executes the processes from S405 to S407 again.

When n exceeds 4 (Yes in S408), that is, five loop processes are completed, the memory controller 20 separates read data obtained through the five shift read operations SFT1 to SFT5 corresponding to the five loop processes as the separated data XR (S410).

Here, since the lower page is a processing target, in S410, read data obtained through the respective shift read operations is separated as separated data AR, DR, FR, and KR. In the process in S410, the separated data AR, DR, FR, and KR are acquired by using the read data CR, ER, and HR obtained in S401 to S403 as mask data.

The same processes as in S313 to S316 are executed in S411 to 5414, and the process of adjusting a read voltage by using a single-plane read operation is finished.

In the above description, a description has been made of a case of employing a method in which 4-bit data is stored in each memory cell. The techniques related to the first embodiment and the subsequent embodiments may be applied to any memory system as long as the number of bits of data stored in each memory cell is plural (i.e., greater than 1).

The memory chip 10 was described to include two planes such as the planes P0 and P1. The techniques related to the first embodiment and the subsequent embodiments may also be applied to a memory system provided with the memory chip 10 having three or more planes. For example, the memory chip 10 may have four planes. Or, for example, the memory chip 10 may have sixteen planes.

For example, the memory controller 20 causes the memory chip 10 to execute a multi-plane read operation in which three or more planes execute shift read operations in parallel, and can thus reduce the time required for a desired number of shift read operations. The memory controller 20 may operate all planes of the memory chip 10 in parallel, and may operate a plurality of some planes in parallel among planes of the memory chip 10.

As mentioned above, related to the first embodiment, the memory chip 10 has the plane P0 and the plane P1 as examples of a plurality of planes. 4-bit data as an example of data of a plurality of bits is stored in a memory cell of each plane, and thus a single word line stores 4-page data. The memory controller 20 causes the memory chip 10 to execute shift read operations on the plane P0 and the plane P1 in parallel by making shift amounts of a plurality of read voltages different from each other, the shift read operations being operations of executing a read operation on one page as a read target among pieces of data of four pages by using the plurality of read voltages. The memory controller 20 adjusts the plurality of read voltages on the basis of read data acquired from the plane P0 and read data acquired from the plane P1.

Consequently, shift read operations of the number required for an estimation process are separately executed on a plurality of planes, and the shift read operations are executed on the respective planes in parallel. As a result, the time required to execute shift read operations of the number required for an estimation process is reduced compared with a case where a multi-plane read operation is not used. In other words, the time required to adjust a read voltage is reduced.

According to the first embodiment, the memory controller 20 causes the memory chip 10 to execute single-state read operations for acquiring mask data, that is, mask data read operations on the plane P0 and the plane P1 in parallel. The memory controller 20 adjusts a plurality of read voltages on the basis of a plurality of portions of data obtained through shift read operations and mask data obtained through the single-state read operations.

Consequently, acquisition of mask data required for an estimation process can be executed on a plurality of planes in parallel.

According to the first embodiment, as described above, shift read operations of the number in accordance with the number of bins of the histogram 100 are necessary. For example, when n shift read operations are necessary, the memory controller 20 may execute m shift read operations on a plurality of planes according to multi-plane read operations. Therefore, the memory controller 20 can acquire data obtained through the m shift read operations according to n (where n<m) multi-plane read operations.

For example, when the histogram 100 having three bins is desired to be obtained, four shift read operations are necessary. Therefore, when the number of planes provided in the memory chip 10 is two, four shift read operations can be realized by executing two multi-plane read operations in which the two planes execute shift read operations in parallel. When the number of planes provided in the memory chip 10 is four, four shift read operations can be realized by executing one multi-plane read operation in which the four planes execute shift read operations in parallel.

According to the first embodiment, the memory controller 20 causes the memory chip 10 to execute a multi-plane read operation in which the plane P0 and the plane P1 execute single-state read operations for acquiring mask data in parallel. The memory controller 20 acquires separated data for each read voltage by executing logical calculation based on the m pieces of data obtained through the shift read operations and the mask data.

Consequently, even though a single-state read operation is not executed for each read voltage, the read data XR for each read voltage can be acquired as separated data through a shift read operation.

In the first embodiment, when an error correction operation performed by the ECC circuit 23 fails, an estimation process and a read operation using an estimated value of an optimal read voltage obtained through the estimation process are retried. A trigger to execute an estimation process is not limited thereto. The memory controller 20 may execute an estimation process at any timing.

A modification example of the first embodiment will be described hereinbelow.

Modification Example 1

According to the first embodiment, the histogram 100 is generated for each read voltage used in a boundary read operation. When a distribution of a threshold voltage does not change much, in the histogram 100 related to a certain read voltage, a single minimum point corresponding to an optimal value of the read voltage appears. However, when a distribution of a threshold voltage changes beyond a certain amount, in the histogram 100 related to a certain read voltage, in addition to a minimum point corresponding to an optimal value of the read voltage, minimum points corresponding to optimal values of other read voltages adjacent to the read voltage may appear. In such a case, it is necessary to identify a minimum point corresponding to an optimal value of a desired read voltage from a plurality of minimum points appearing in the single histogram 100.

The memory controller 20 may identify the minimum point corresponding to the optimal value of the desired read voltage on the basis of separated data. Generally, data writing is executed such that threshold voltages of a plurality of memory cells forming a single word line are uniformly distributed to the sixteen states such as the Er state to the O state through a process called randomizing. Therefore, when separated data is acquired by using a voltage close to an optimal value of a read voltage, the number of "1s" indicating memory cells in an ON state, included in the separated data is y/16 of the number of bits of the separated data. Here, y is a positive integer corresponding to an optimal value of a read voltage.

For example, when a voltage around an optimal value of the read voltage VA is used, the number of "1s" included in separated data is about 1/16 of the number of bits of the separated data.

For example, when a voltage around an optimal value of the read voltage VB is used, the number of "1s" included in separated data is about 2/16 of the number of bits of the separated data.

For example, when a voltage around an optimal value of the read voltage VC is used, the number of "1s" included in separated data is about 3/16 of the number of bits of the separated data.

For example, when a voltage around an optimal value of the read voltage VD is used, the number of "1s" included in separated data is about 4/16 of the number of bits of the separated data.

For example, when a voltage around an optimal value of the read voltage VE is used, the number of "1s" included in separated data is about 5/16 of the number of bits of the separated data.

For example, when a voltage around an optimal value of the read voltage VF is used, the number of "1s" included in separated data is about 6/16 of the number of bits of the separated data.

For example, when a voltage around an optimal value of the read voltage VG is used, the number of "1s" included in separated data is about 7/16 of the number of bits of the separated data.

For example, when a voltage around an optimal value of the read voltage VH is used, the number of "1s" included in separated data is about 8/16 of the number of bits of the separated data.

For example, when a voltage around an optimal value of the read voltage VI is used, the number of "1s" included in separated data is about 9/16 of the number of bits of the separated data.

For example, when a voltage around an optimal value of the read voltage VJ is used, the number of "1s" included in separated data is about 10/16 of the number of bits of the separated data.

For example, when a voltage around an optimal value of the read voltage VK is used, the number of "1s" included in separated data is about 11/16 of the number of bits of the separated data.

For example, when a voltage around an optimal value of the read voltage VL is used, the number of "1s" included in separated data is about 12/16 of the number of bits of the separated data.

For example, when a voltage around an optimal value of the read voltage VM is used, the number of "1s" included in separated data is about 13/16 of the number of bits of the separated data.

For example, when a voltage around an optimal value of the read voltage VN is used, the number of "1s" included in separated data is about 14/16 of the number of bits of the separated data.

For example, when a voltage around an optimal value of the read voltage VO is used, the number of "1s" included in separated data is about 15/16 of the number of bits of the separated data.

Therefore, for example, when a certain minimum point appears in the histogram 100, the memory controller 20 may identify a read voltage corresponding to the minimum point on the basis of a count value of the number of "1s" included in separated data corresponding to one of two voltages at boundaries of a section in which the minimum point appears. When a plurality of minimum points appear in the histogram 100 related to a certain read voltage, the memory controller 20 may be configured to identify a minimum point corresponding to an optimal value of a desired read voltage among the plurality of minimum points on the basis of the separated data.

Modification Example 2

In the above description, in a single shift read operation, a plurality of read voltages are shifted by the same amount from reference values. Shift amounts from reference values need not be the same as each other among a plurality of read voltages. The memory controller 20 may compute a positive or negative shift amount of a certain read voltage as appropriate. The number of shift read operations may be statically set, and may be dynamically changed by the memory controller 20.

For example, when pieces of separated data XR1, XR2, and XR3 are obtained through three shift read operations respectively using Shift_x1, Shift_x2, and Shift_x3, the memory controller 20 can define frequencies of two bins adjacent to each other of the histogram 100. It is assumed that Shift_x1<Shift_x2<Shift_x3. A bin of a section partitioned by Shift_x1 and Shift_x2 will be referred to as a bin B1. A bin of a section partitioned by Shift_x2 and Shift_x3 will be referred to as a bin B2. A frequency of the bin B1 is indicated by D1, and a frequency of the bin B2 is indicated by D2.

The histogram 100 is used to retrieve a minimum point of the histogram 100. Therefore, if D1>D2, it may be estimated that a minimum point appears in the bin B2 or a minimum point appears in a bin on a positive side of Shift_x3. In such a case, the memory controller 20 may set Shift_x4 larger than Shift_x3, and may execute the next shift read operation. The memory controller 20 may execute one or more shift read operations while sequentially shifting a shift amount related to the read voltage XV toward a positive side until a minimum point can be recognized. When the memory chip 10 has two planes, two shift read operations in which a shift amount related to the read voltage XV is shifted toward a positive side of the Shift_x3 can be implemented by one multi-plane read operation.

If D1<D2, it may be estimated that a minimum point appears in the bin B1 or a minimum point appears in a bin on a negative side of Shift_x1. In such a case, the memory controller 20 may set Shift_x4 smaller than Shift_x1, and may execute the next shift read operation. The memory controller 20 may execute one or more shift read operations while sequentially shifting a shift amount related to the read voltage XV toward a negative side until a minimum point can be recognized. When the memory chip 10 has two planes, two shift read operations in which a shift amount related to the read voltage XV is shifted toward a negative side of the Shift_x1 can be realized by one multi-plane read operation.

The memory controller 20 may separately perform, for each read voltage, a process of determining a shift amount in the next shift read operation on the basis of a frequency. The memory controller 20 may execute a shift read operation until a minimum point can be recognized at each read voltage.

An example of a technique of determining a shift amount on the basis of a frequency is disclosed in JP-A-2018-163724 entitled "Memory System". The entire contents of the technique disclosed in JP-A-2018-163724 are incorporated in the present specification by reference.

Second Embodiment

Next, a memory system related to a second embodiment will be described. The second embodiment is different from the first embodiment in terms of a process of estimating an optimal value of a read voltage. In the memory system related to the second embodiment, a method using an estimation function may be applied to a process of estimating an optimal value of a read voltage.

Figure 27:
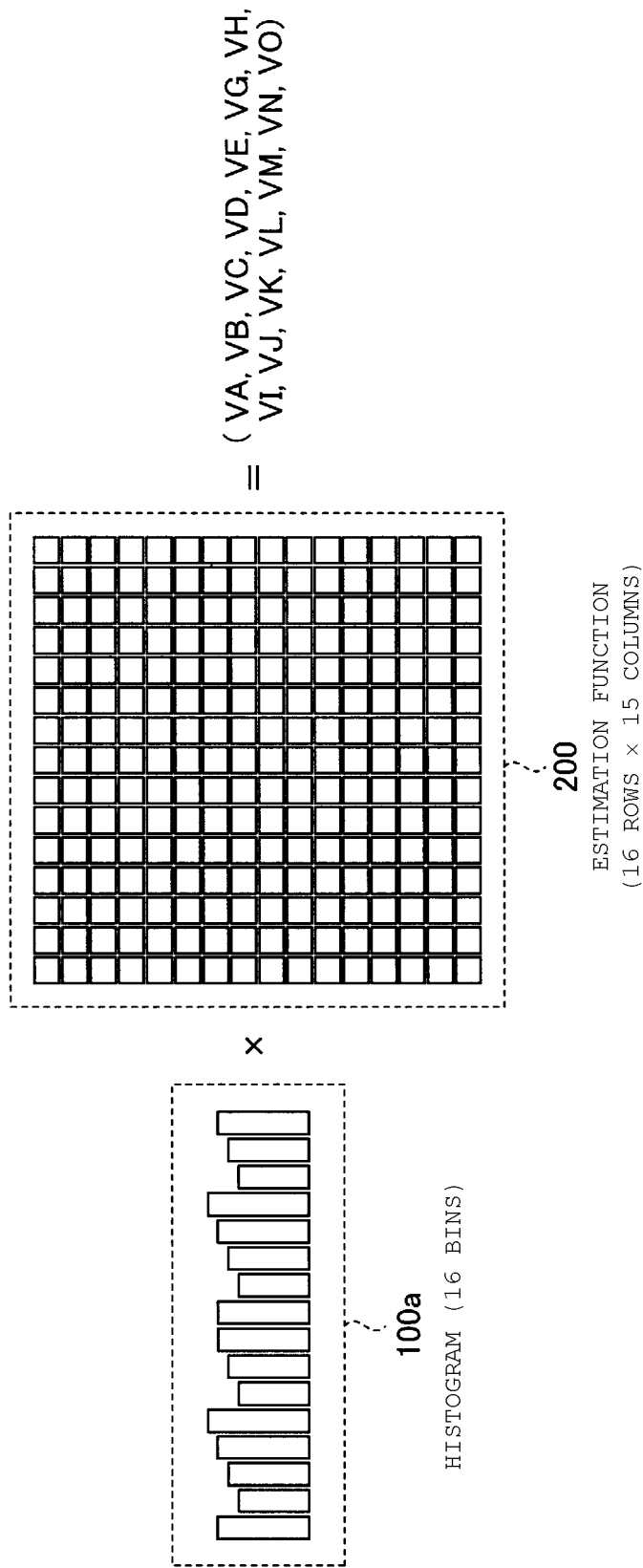
FIG. 27 is a schematic diagram illustrating a method of estimating an optimal value of a read voltage by using an estimation function according to a second embodiment.

FIG. 27 is a schematic diagram illustrating an example of a method of estimating an optimal value of a read voltage by using an estimation function related to the second embodiment.

The memory controller 20 executes a read operation by using a plurality of reference read voltages set in advance, and thus acquires a histogram indicating the number of memory cells with respect to a threshold voltage. The plurality of reference read voltages are set on the basis of ranges that can be taken by threshold voltages.

For example, as the plurality of reference read voltages, default values of the respective read voltages VA, VB, VC, VD, VE, VF, VG, VH, VI, VJ, VK, VL, VM, VN, and VO may be used. A method of setting a plurality of reference read voltages is not limited thereto. The number of reference read voltages may be freely selected.

When default values of the fifteen read voltages VA to VO are used as a plurality of reference read voltages, in the second embodiment, the memory controller 20 can acquire a histogram 100a having sixteen bins such as fourteen segments partitioned by adjacent reference read voltages, a segment on a negative side of the read voltage VA and a segment on a positive side of the read voltage VO, used as bins.

An estimation function 200 is a matrix formed by sixteen rows and fifteen columns. The number of rows of the estimation function 200 is the same as the number of bins of the histogram 100a. The number of columns of the estimation function 200 is the same as the number of estimated optimal read voltages. The memory controller 20 multiplies a vector having values (frequencies) of the respective bins of the histogram 100a as elements by the estimation function 200 from the right side thereof, to obtain a vector having fifteen elements. The fifteen elements correspond to estimated values of optimal values of the read voltages VA to VO.

In other words, the estimation function 200 illustrated in FIG. 27 is a function created as a regression model that maps the histogram onto optimal values of the read voltages VA to VO. The estimation function 200 is created by using a plurality of pairs of histograms and optimal values of the read voltages VA to VO collected from, for example, one or more memory chips 10. In the second embodiment, an optimal value of a read voltage estimated by using the estimation function 200 is used in an actual read operation in the subsequent shift read operation and will thus be referred to as an actual read voltage.

Figure 28:
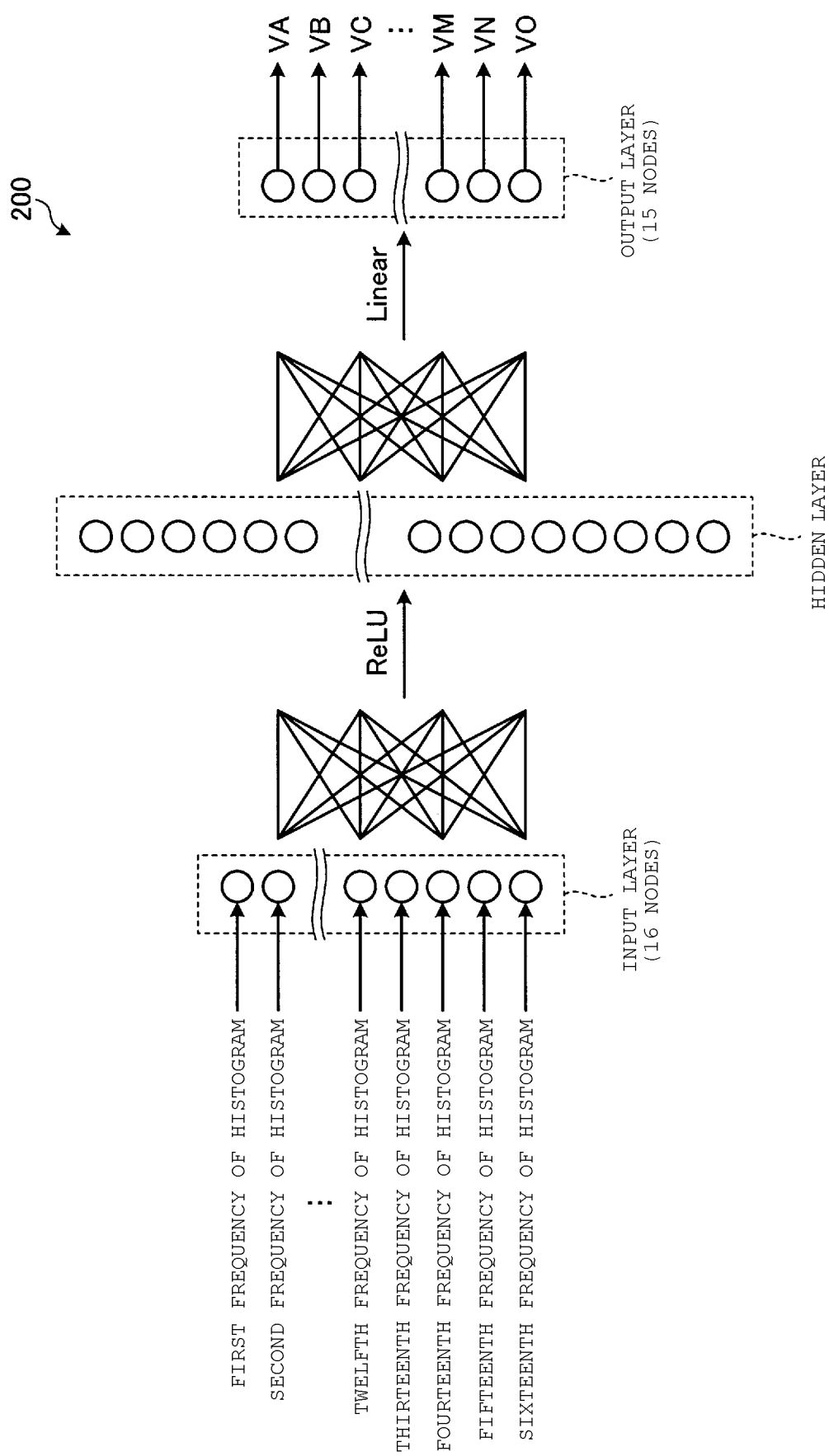
FIG. 28 is a schematic diagram illustrating another configuration of the estimation function according to a second embodiment.

The estimation function 200 need not necessarily have a matrix structure. FIG. 28 is a schematic diagram illustrating another example of a configuration of the estimation function 200 related to the second embodiment. As illustrated in FIG. 28, the estimation function 200 has a structure of a neural network model.

In the example illustrated in FIG. 28, the estimation function 200 is a neural network model having a configuration of a multi-layer perceptron (MLP) having one hidden layer. The neural network model as the estimation function 200 may be a fully connected MLP, and may be a sparsely connected MLP. An activation function used for the hidden layer is, for example, a rectified linear units (ReLU) function, and an activation function used for an output layer is, for example, a linear function. The number of hidden layers of the estimation function 200 may be two or more. An activation function used for the hidden layer is not limited to the ReLU function.

A histogram is input to an input layer of the neural network. In other words, the input layer has nodes of the number (that is, sixteen) corresponding to the number of bins of a histogram as nodes to which the histogram is input. The output layer of the neural network model has nodes of the number (that is, fifteen) corresponding to the number of the read voltages VA to VO. The hidden layer has one or more nodes.

In the hidden layer and the output layer, each node multiplies a bias and respective input values from the nodes of the previous layer by a weight, applies the activation function to a sum total of respective values after being multiplied by the weight, and outputs values obtained by applying the activation function.

Each weight is determined in advance through training. In other words, the neural network model as the estimation function 200 is trained in advance to map a histogram onto optimal values of the read voltages VA to VO.

As mentioned above, not only a matrix but also a neural network model may be used as the estimation function 200.

The histogram 100a having sixteen bins can be acquired by performing a single-state read operation using each of a plurality of reference read voltages. In other words, when fifteen reference read voltages are used, the histogram 100a may be generated by using read data that is obtained through fifteen single-state read operations.

In the second embodiment, fifteen single-state read operations are executed on the plane P0 and the plane P1. A single-state read operation on the plane P0 and a single-state read operation on the plane P1 can be executed in parallel according to a multi-plane read operation. Consequently, the time required for the fifteen single-state read operations is reduced as compared to when the fifteen single-state read operations are executed according to a single-plane read operation.

Figure 29:
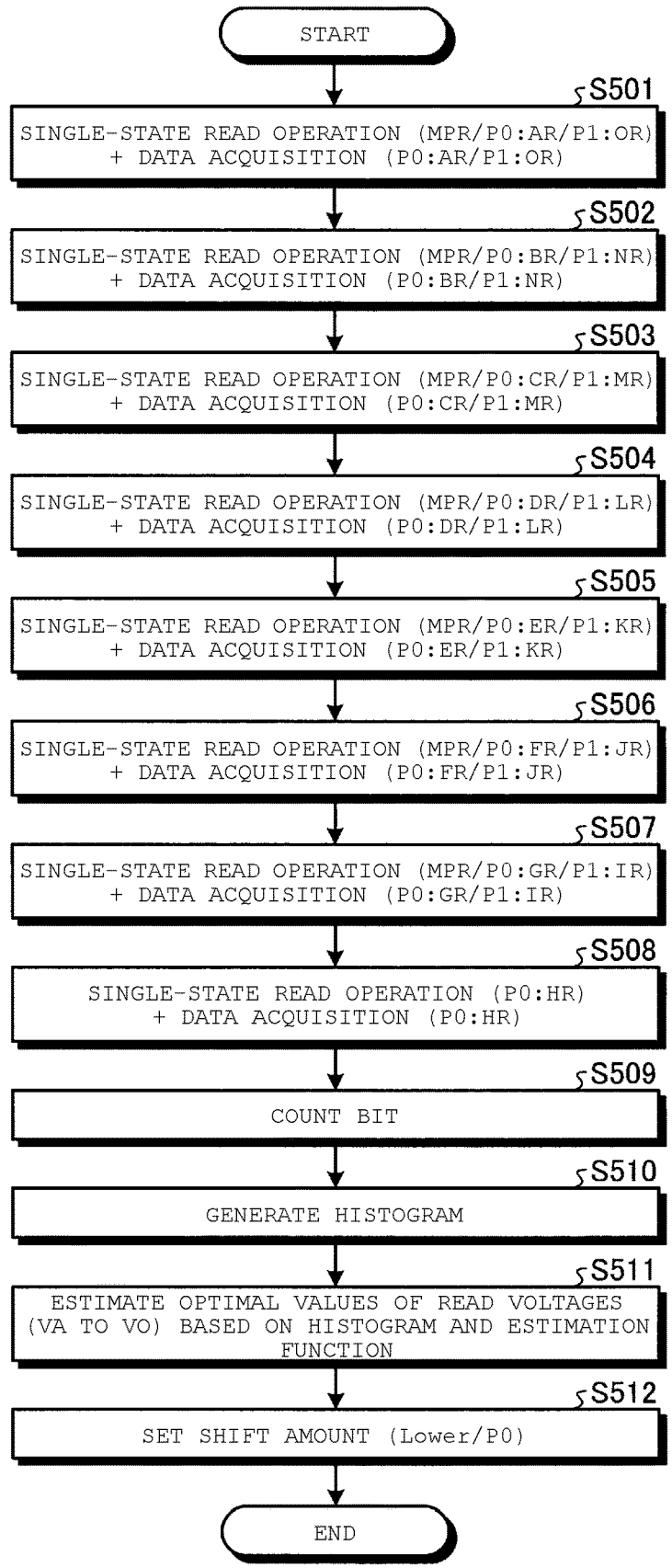
FIG. 29 is a flowchart illustrating a process of adjusting a read voltage by using a multi-plane read operation according to a second embodiment.

FIG. 29 is a flowchart illustrating an example of a process related to the second embodiment of adjusting a read voltage by using a multi-plane read operation. The process illustrated in FIG. 29 is executed in S204.

In the second embodiment, fifteen single-state read operations are realized by seven multi-plane read operations and one single-plane read operation.

Specifically, first, in S501, the memory controller 20 instructs the memory chip 10 to execute a multi-plane read operation of executing a single-state read operation for acquiring the read data AR from the plane P0 (more specifically, the target word line in the target block) and a single-state read operation for acquiring the read data OR from the plane P1 (more specifically, a word line in the pair block that is written at the same time as that of the target word line) in parallel. The memory controller 20 transmits the single-state read (MPR) command sequence to the memory chip 10, and thus gives an instruction for the multi-plane read operation. The memory controller 20 acquires the read data AR read from the plane P0 and the read data OR read from the plane P1. The data output command sequence is used to acquire the read data.

Next, in S502, the memory controller 20 instructs the memory chip 10 to execute a multi-plane read operation of executing a single-state read operation for acquiring the read data BR from the plane P0 and a single-state read operation for acquiring the read data NR from the plane P1 in parallel. The memory controller 20 acquires the read data BR read from the plane P0 and the read data NR read from the plane P1.

Next, in S503, the memory controller 20 instructs the memory chip 10 to execute a multi-plane read operation of executing a single-state read operation for acquiring the read data CR from the plane P0 and a single-state read operation for acquiring the read data MR from the plane P1 in parallel. The memory controller 20 acquires the read data CR read from the plane P0 and the read data MR read from the plane P1.

Next, in S504, the memory controller 20 instructs the memory chip 10 to execute a multi-plane read operation of executing a single-state read operation for acquiring the read data DR from the plane P0 and a single-state read operation for acquiring the read data LR from the plane P1 in parallel. The memory controller 20 acquires the read data DR read from the plane P0 and the read data LR read from the plane P1.

Next, in S505, the memory controller 20 instructs the memory chip 10 to execute a multi-plane read operation of executing a single-state read operation for acquiring the read data ER from the plane P0 and a single-state read operation for acquiring the read data KR from the plane P1 in parallel. The memory controller 20 acquires the read data ER read from the plane P0 and the read data KR read from the plane P1.

Next, in S506, the memory controller 20 instructs the memory chip 10 to execute a multi-plane read operation of executing a single-state read operation for acquiring the read data FR from the plane P0 and a single-state read operation for acquiring the read data JR from the plane P1 in parallel. The memory controller 20 acquires the read data FR read from the plane P0 and the read data JR read from the plane P1.

Next, in S507, the memory controller 20 instructs the memory chip 10 to execute a multi-plane read operation of executing a single-state read operation for acquiring the read data GR from the plane P0 and a single-state read operation for acquiring the read data IR from the plane P1 in parallel. The memory controller 20 acquires the read data GR read from the plane P0 and the read data IR read from the plane P1.

Next, in S508, the memory controller 20 instructs the memory chip 10 to execute a single-state read operation for acquiring the read data HR from the plane P0. The single-state read operation for acquiring the read data HR from the plane P0 is executed according to a single-plane read operation. The memory controller 20 acquires the read data HR read from the plane P0.

In S501 to S508, default values are respectively used as the read voltages VA to VO.

Next, the memory controller 20 counts the number of "1s" indicating memory cells in an ON state with respect to each piece of the read data AR to OR obtained in S501 to S508 (S509). The memory controller 20 generates the histogram 100a on the basis of a result of counting the number of "1s" indicating memory cells in an ON state (S510).

The memory controller 20 estimates optimal values VA' to VO' of the read voltages VA to VO on the basis of the histogram 100a and the estimation function 200 (S511). The estimation function 200 may be a matrix formed of sixteen rows and fifteen columns, and may be a neural network model having sixteen input nodes and fifteen output nodes.

The memory controller 20 sets a shift amount such that estimated values of the optimal values VA', VD', VF', and VK' are used as the read voltages VA, VD, VF, and VK during a read operation on the plane P0 (S512). Consequently, shift read operations using the adjusted read voltages are executable on a target page.

The process of adjusting a read voltage by using a multi-plane read operation is finished after the shift amount is set (S512).

Figure 30:
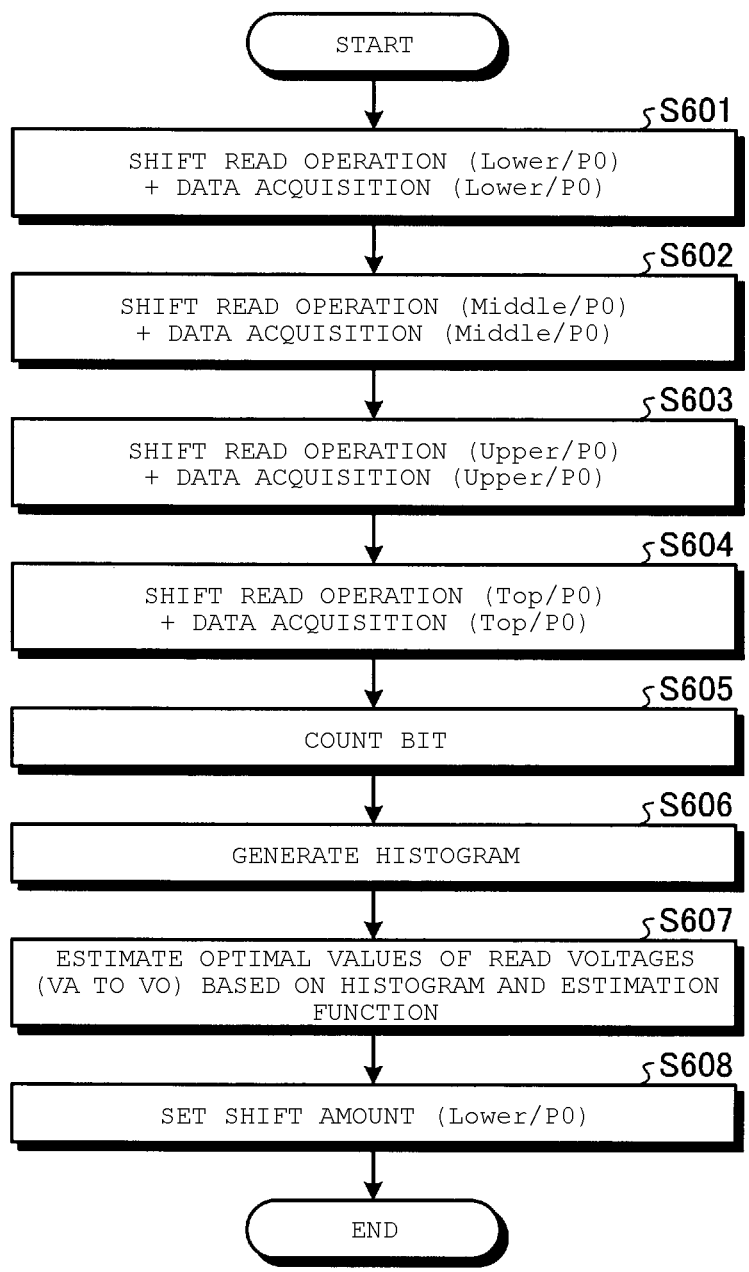
FIG. 30 is a flowchart illustrating a process of adjusting a read voltage by using a single-plane read operation according to a second embodiment.

FIG. 30 is a flowchart illustrating an example of a process related to the second embodiment for adjusting a read voltage using a single-plane read operation. The process illustrated in FIG. 30 is executed in S205.

In the second embodiment, default values of the read voltages VA to VO are used as fifteen reference read voltages. In the example illustrated in FIG. 30, a total of four shift read operations of reading data of a lower page, a middle page, an upper page, and a top page are executed with respect to the plane P0 (specifically, each page of the target word line of the plane P0) by using the default values. A plurality of memory cells connected to the target word line are classified as a total of sixteen states such as the Er state to the O state on the basis of respective pieces of data of the lower page, the middle page, the upper page, and the top page. The number of memory cells classified as each of the Er state to the O state is treated as a frequency of each of sixteen bins of the histogram 100a.

Specifically, in S601, the memory controller 20 causes the memory chip 10 to execute a shift read operation of reading data of the lower page with respect to the plane P0 (specifically, each page of the target word line of the plane P0). Read data that is read from the lower page is acquired.

In S602, the memory controller 20 causes the memory chip 10 to execute a shift read operation of reading data of the middle page with respect to the plane P0. Read data that is read from the middle page is acquired.

In S603, the memory controller 20 causes the memory chip 10 to execute a shift read operation of reading data of the upper page with respect to the plane P0. Read data that is read from the upper page is acquired.

In S604, the memory controller 20 causes the memory chip 10 to execute a shift read operation of reading data of the top page with respect to the plane P0. Read data that is read from the top page is acquired.

In S601 to S604, default values are used as the read voltages VA to VO.

In S605, the memory controller 20 counts the number of memory cells in each state on the basis of the data of the four pages read in S601 to S604.

The memory controller 20 generates the histogram 100a having a count value at each state as a frequency (S606).

The same processes as in S510 and S511 are executed in S607 and S608, and the process ends after the shift amount is set in S608.

As mentioned above, according to the second embodiment, the memory chip 10 has the plane P0 and the plane P1 as examples of a plurality of planes. 4-bit data as an example of data of a plurality of bits is stored in a memory cell of each plane, and thus a single word line stores 4-page data. The memory controller 20 causes the memory chip 10 to execute a multi-plane read operation of executing single-state read operations using one of a plurality of reference read voltages on the plane P0 and the plane P1 in parallel. In the multi-plane read operation, different reference read voltages among the plurality of reference read voltages are used in the plane P0 and the plane P1. The memory controller 20 acquires an actual read voltage for reading 4-bit data on the basis of read data that is acquired from each plane through the single-state read operation.

Consequently, single-state read operations respectively using a plurality of reference read voltages are executed on a plurality of planes, and the single-state read operations can be executed on the respective planes in parallel. As a result, the time required to execute the required single-state read operations for an estimation process can be reduced as compared to when a multi-plane read operation is not used. In other words, the time required to adjust a read voltage is reduced.

According to the second embodiment, a single-state read operation using each reference read voltage is necessary. When the number of reference read voltages is m, then m single-state read operations are necessary. The memory controller 20 may execute m single-state read operations on a plurality of planes through a multi-plane read operation. Therefore, the memory controller 20 can acquire the read data XD related to each of the m reference read voltages through n (where n<m) multi-plane read operations.

According to the second embodiment, the memory controller 20 generates the histogram 100a on the basis of the read data XD related to each of them reference read voltages, and acquires an actual read voltage on the basis of the histogram 100a and the estimation function 200.

Also in the second embodiment, when an error correction operation performed by the ECC circuit 23 fails, an estimation process and a read operation using an estimated value of an optimal read voltage obtained through the estimation process are retried. A trigger to execute an estimation process is not limited thereto. The memory controller 20 may execute an estimation process at any timing.

In the above description, the estimation function 200 is configured to map the histogram 100a having sixteen bins onto optimal values of the fifteen read voltages VA to VO. The number of bins of the histogram 100a that are input to the estimation function 200 may be freely selected. For example, the estimation function 200 may be configured to map the histogram 100a having eight bins onto optimal values of the fifteen read voltages VA to VO. For example, the estimation function 200 may be configured to map the histogram 100a having thirty-two bins onto optimal values of the fifteen read voltages VA to VO. As the number of bins of the histogram 100a is increased, estimation accuracy can be improved.

Figure 31:
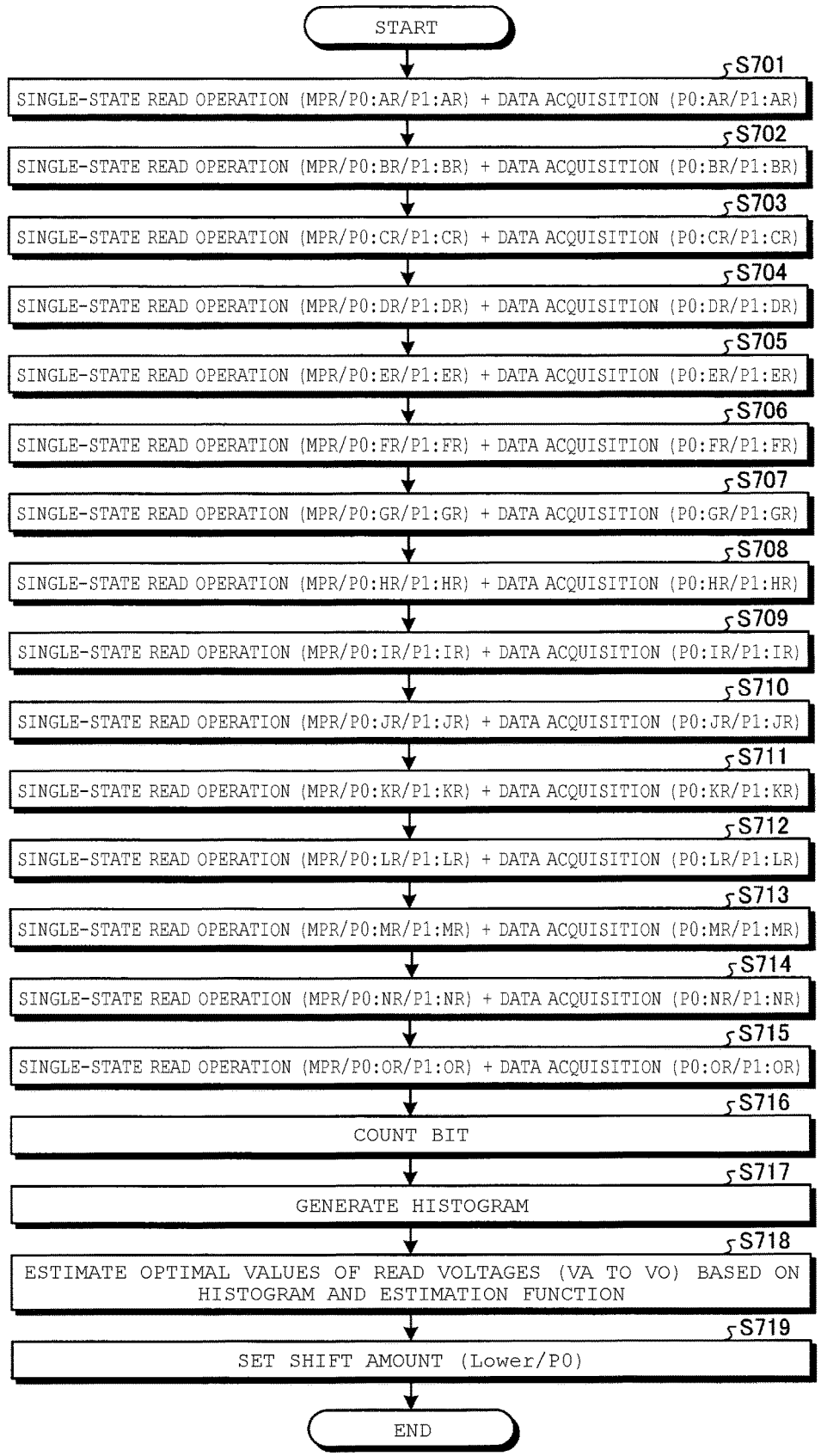
FIG. 31 is a flowchart illustrating another process of adjusting a read voltage by using a multi-plane read operation according to a second embodiment.

FIG. 31 is a flowchart illustrating another example of the process related to the second embodiment for adjusting the read voltage using the multi-plane read operation. The process illustrated in FIG. 31 is executed in S204.

In the example illustrated in FIG. 31, the estimation function 200 configured to map the histogram having thirty-two bins onto optimal values of the fifteen read voltages VA to VO is used. The histogram 100a having the thirty-two bins is formed by a combination of a histogram having sixteen bins obtained by using default values of the fifteen read voltages VA to VO for the plane P0 as fifteen reference read voltages and a histogram having sixteen bins obtained by using default values of the fifteen read voltages VA to VO for the plane P1 as fifteen reference read voltages.

Single-state read operations using the reference read voltages on the plane P0 and the plane P1 are executed in parallel through a multi-plane read operation.

Specifically, for example, in S701, the memory controller 20 instructs the memory chip 10 to execute a multi-plane read operation of executing single-state read operations for acquiring the read data AR from the plane P0 (more specifically, the target word line in the target block) and the plane P1 (more specifically, a word line in the pair block that is written at the same time as that of the target word line) in parallel. The memory controller 20 transmits the single-state read (MPR) command sequence to the memory chip 10, and thus gives an instruction for the multi-plane read operation. The memory controller 20 acquires the read data AR read from each of the plane P0 and the plane P1. The data output command sequence is used to acquire the read data.

In each of S702 to S715, single-state read operations on the plane P0 and the plane P1 are executed according to a multi-plane read operation in the same manner as in S701. Consequently, the read data BR to OR is acquired from each of the plane P0 and the plane P1.

Next, the memory controller 20 counts the number of "1s" indicating memory cells in an ON state with respect to each piece of the read data AR to OR obtained from each of the plane P0 and the plane P1 in S701 to S715 (S716).

The memory controller 20 generates the histogram 100a having thirty-two bins on the basis of a result of counting the number of "1s" indicating memory cells in an ON state (S717). In other words, a set including a histogram having eight bins generated on the basis of the number of "1s" of each piece of the read data AR to OR obtained from the plane P0 and a histogram having eight bins generated on the basis of the number of "1s" of each piece of the read data AR to OR obtained from the plane P1 is treated as the histogram 100a having the thirty-two bins.

The memory controller 20 estimates optimal values VA' to VO' of the read voltages VA to VO on the basis of the histogram 100a and the estimation function 200 (S718). The estimation function 200 may be a matrix formed of thirty-two rows and fifteen columns, and may be a neural network model having thirty-two input nodes and fifteen output nodes.

The memory controller 20 sets a shift amount such that estimated values of the optimal values VA', VD', VF', and VK' are used as the read voltages VA, VD, VF, and VK during a read operation on the plane P0 (S719). Consequently, shift read operations using the adjusted read voltages are executable on a target page.

The process of adjusting a read voltage by using a multi-plane read operation is finished after the shift amount is set (S719).

While certain embodiments have been described, these embodiments have been presented by way of example only, and are not intended to limit the scope of the inventions as described herein. Indeed, the novel embodiments described herein may be embodied in a variety of other forms; furthermore, various omissions, substitutions and changes in the form of the embodiments described herein may be made without departing from the spirit of the inventions as described herein. The accompanying claims and their equivalents are intended to cover such forms or modifications as would fall within the scope and spirit of the inventions as described herein.

What is claimed is:

1. A memory system, comprising:
a memory chip that includes a first plane and a second plane, the first plane and the second plane each including a plurality of memory cells and a word line connected to the plurality of memory cells, each of the plurality of memory cells having a threshold voltage corresponding to multi-bit data; and a memory controller configured to:
cause the memory chip to execute a first read process on the first plane and the second plane in parallel by using a plurality of first read voltages, the first read voltages for the first plane and for the second plane being at different voltage levels from each other, the first read process being a process of reading a data group of one bit from the plurality of memory cells by using the first read voltages, and adjust the first read voltages on the basis of the data group read from the first plane and the data group read from the second plane.

2. The memory system according to claim 1, wherein the memory controller causes the memory chip to execute a second read process on the first plane and the second plane in parallel using a second read voltage and a third read voltage, the second read voltage is one of the plurality of first read voltages, the third read voltage is the first read voltage that is next highest in voltage level to the second read voltage from among the plurality of first read voltages, the second read process includes applying a fourth read voltage, which is at a voltage level between the second read voltage and the third read voltage, to the word line and then sensing an ON or OFF state of the plurality of memory cells, and the voltage levels of the plurality of first read voltages are subsequently adjusted on the basis of the data group read from the first plane, the data group read from the second plane, and sensing results acquired through the second read process.

3. The memory system according to claim 1, wherein the memory controller is configured to:
cause the memory chip to execute the first read process on the first plane and the second plane in parallel n times, where n is an integer greater than or equal to 1, while making the first read voltages used for the first and second planes different from each other, and thereby acquire m data groups, where m is an integer greater than n, the m data groups including the data read from the first plane and the data read from the second plane, and
adjust the voltage levels of each of the plurality of first read voltages on the basis of the m data groups.

4. The memory system according to claim 3, wherein the first read process includes applying the plurality of first read voltages to the word line, sensing an ON or OFF state of the plurality of memory cells at each of the plurality of first read voltages applied to the word line, and acquiring a data group on the basis of a sensing result acquired at each of the first read voltages, and
the memory controller is configured to:
calculate the sensing result for each of the plurality of first read voltages from the m data groups,
generate a histogram indicating the number of memory cells with a threshold voltage on the basis of the calculated sensing results, and
adjust the voltage levels of the plurality of first read voltages on the basis of the histogram.

5. The memory system according to claim 4, wherein the memory controller is configured to cause the memory chip to execute a second read process on the first plane and the second plane in parallel with a second read voltage for the first plane and a third read voltage for the second plane, the second read voltage is one of the plurality of first read voltages, the third read voltage is the first read voltage that is next highest in voltage level to the second read voltage among the plurality of first read voltages, the second read process includes applying a fourth read voltage, which is at a level between the second read voltage and the third read voltage, to the word line and then sensing an ON or OFF state of the plurality of memory cells, and sensing results for the plurality of first read voltages are acquired through a logical calculation using the m data groups and the sensing results acquired through the second read process.

6. The memory system according to claim 1, wherein the memory controller is configured to:
cause the memory chip to execute a third read process on the first plane, the third read process being the same process as the first read process,
execute an error correction operation on the data group acquired from the first plane in the third read process,
cause the memory chip to execute the first read process on the first plane and the second plane in parallel with adjusted first read voltages when the error correction operation fails, and
cause the memory chip to execute the third read process on the first plane again using the adjusted first read voltages.

7. The memory system according to claim 6, wherein the memory controller is configured to:
cause the memory chip to execute the first read process on the first plane and the second plane in parallel if a block corresponding to the plurality of memory cells of the second plane is not a failed block, and
not cause the memory chip to execute the first read process on the first plane and the second plane in parallel if a block corresponding to the plurality of memory cells of the second plane is a failed block.

8. A memory system, comprising:
a memory chip that includes a first plane and a second plane, each of the first plane and the second plane including a plurality of memory cells and a word line connected to the plurality of memory cells, the memory cells each having a threshold voltage corresponding to multi-bit data; and
a memory controller configured to:
cause the memory chip to execute a first read process on the first plane and the second plane in parallel using different reference read voltages for the first plane and for the second plane selected from among a plurality of reference read voltages, the first read process including applying a reference read voltage to the word line and sensing of an ON or OFF state of the memory cells, and
set actual read voltages for reading data from the first plane and the second plane on the basis of sensing results from a plurality of first read processes using the reference read voltages.

9. The memory system according to claim 8, wherein there are m reference read voltages in the plurality of reference read voltages, where m is an integer value greater than or equal to 1, and
the memory controller causes the memory chip to execute the first read process on the first plane and the second plane in parallel n times using reference read voltages that are different from each other for the first and second planes, where n is an integer value greater than or equal to 1, and thereby acquires m sensing results corresponding to the different reference read voltages.

10. The memory system according to claim 9, wherein the memory controller is configured to:
   generate a histogram indicating the number of memory cells with a threshold voltage on the basis of the m sensing results, and
   acquire the actual read voltages on the basis of the histogram and an estimation function.

11. The memory system according to claim 8, wherein the memory controller is configured to:
   cause the memory chip to execute a second read process on the first plane, the second read process being a process of reading data using the actual read voltages,
   perform an error correction operation on the data acquired from the first plane in the second read process,
   cause the memory chip to execute the first read process on the first plane and the second plane in parallel to adjust the actual read voltages if the error correction operation fails, and
   cause the memory chip to execute the second read process on the first plane using the adjusted actual read voltages.

12. The memory system according to claim 11, wherein the memory controller is configured to:
   cause the memory chip to execute the first read process on the first plane and the second plane in parallel if a block corresponding to the plurality of memory cells of the second plane is not a failed block, and
   not cause the memory chip to execute the first read process on the first plane and the second plane in parallel if a block corresponding to the plurality of memory cells of the second plane is a failed block.

13. The memory system according to claim 11, wherein the memory chip is a non-volatile memory.

14. A method for a memory system that includes a memory controller, and a memory array that includes a first plane and a second plane, the method comprising:
   executing a first read process on the first plane and the second plane in parallel using a plurality of first read voltages, the first read voltages for the first plane and for the second plane being at different voltage levels, the first read process being a process of reading a data group of one bit from multi-bit data stored in memory cells of the memory array; and
   adjusting voltage levels of the plurality of first read voltages on the basis of the data read from the first plane and the second plane in the first read process.

15. The method according to claim 14, further comprising:
   executing a second read process on the first plane and the second plane in parallel by respectively providing a second read voltage and a third read voltage thereto, the second read voltage being one of the plurality of first read voltages, the third read voltage being the first read voltage that is next highest in voltage level to the second read voltage from among the plurality of first read voltages, and the second read process includes applying a fourth read voltage at a voltage level that is between the second read voltage and the third read voltage to the memory cells and sensing an ON or OFF state of the memory cells; and
   adjusting levels of the plurality of first read voltages on the basis of the data read from the first plane, the data read from the second plane, and sensing results acquired through the second read process.

16. The method according to claim 14, wherein the first read process is executed on the first plane and the second plane in parallel n times, where n is an integer greater than or equal to n.

17. The method according to claim 16, further comprising:
   calculating the sensing result at each of the plurality of first read voltages from the m data groups acquired in the n first read processes;
   generating a histogram indicating the number of memory cells with a threshold voltage on the basis of the calculated sensing results; and
   adjusting the plurality of first read voltages on the basis of the histogram.

18. The method according to claim 17, further comprising:
   executing a second read process on the first plane and the second plane in parallel with a second read voltage and a third read voltage, respectively, wherein
   the second read voltage is one of the plurality of first read voltages,
   the third read voltage is the first read voltage that is next highest in voltage level to the second read voltage among the plurality of first read voltages,
   the second read process includes applying a fourth read voltage at a voltage level that is between the second read voltage and the third read voltage to the memory cells and then sensing an ON or OFF state of the memory cells of the first plane and second plane, and
   sensing results for each of the first read voltages are acquired through logical calculation using the m data groups and the sensing results acquired through the second read process.

19. The method according to claim 18, further comprising:
   performing an error correction operation on data read from the second plane, wherein
   the first read process is executed on the first plane and the second plane in parallel if a block corresponding to the memory cells of the second plane is not a failed block; and
   the first read process on the first plane and the second plane is not executed in parallel if a block corresponding to the memory cells of the second plane is a failed block.

20. The method according to claim 14, wherein the memory array is a non-volatile memory.

* * * * *